(12) United States Patent
Wang

(10) Patent No.: US 11,145,526 B2
(45) Date of Patent: Oct. 12, 2021

(54) METHOD OF ANALYZING A MANUFACTURING OF A SEMICONDUCTOR STRUCTURE

(71) Applicant: TAIWAN SEMICONDUCTOR MANUFACTURING COMPANY LTD., Hsinchu (TW)

(72) Inventor: Chih-Yu Wang, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 112 days.

(21) Appl. No.: 16/368,859

(22) Filed: Mar. 29, 2019

(65) Prior Publication Data

US 2020/0105558 A1 Apr. 2, 2020

Related U.S. Application Data

(60) Provisional application No. 62/737,352, filed on Sep. 27, 2018.

(51) Int. Cl.
  *G06T 7/00* (2017.01)
  *H01L 21/67* (2006.01)
  *G06T 1/00* (2006.01)

(52) U.S. Cl.
  CPC ...... *H01L 21/67288* (2013.01); *G06T 1/0014* (2013.01); *G06T 7/0008* (2013.01);
  (Continued)

(58) Field of Classification Search
  CPC ........... H01L 21/67288; H01L 21/6708; H01L 21/67253; H01L 21/67051; H01L 22/12; H01L 22/26; G06T 7/0008; G06T 1/0014; G06T 2207/10048; G06T 2207/30148; G06T 2207/10016
  USPC ....... 382/100, 108, 141, 144, 145, 149, 151, 382/172, 173, 181, 190, 209, 254, 224, 382/312; 257/E21.001, E21.002, 257/E21.211, E21.214, E29.166, E21.16; 438/48, 57, 142; 427/58, 74; 117/84, 117/107
  See application file for complete search history.

(56) References Cited

U.S. PATENT DOCUMENTS 7,027,640 B2 * 4/2006 Park ...................... G01N 21/94
                                                        250/559.14
8,981,337 B1 * 3/2015 Burckel ............ H01L 21/76838
                                                               257/7

(Continued)

*Primary Examiner* — Sheela C Chawan
(74) *Attorney, Agent, or Firm* — WPAT, P.C.; Anthony King

(57) ABSTRACT

A method of monitoring or analyzing a manufacturing of a semiconductor structure includes providing a semiconductor structure; providing a camera disposed around the semiconductor structure; disposing a liquid substance over the semiconductor structure; removing a portion of the semiconductor structure; removing the liquid substance from the semiconductor structure; capturing a plurality of first images of the semiconductor structure by the camera; analyzing the plurality of first images; identifying a region of the semiconductor structure where a residue of the liquid substance is disposed based on the analysis of the plurality of first images; and performing a response based on the identification of the region of the semiconductor structure.

20 Claims, 25 Drawing Sheets

(52) U.S. Cl.
CPC ............... *G06T 2207/10016* (2013.01); *G06T 2207/10048* (2013.01); *G06T 2207/30148* (2013.01)

(56) References Cited

U.S. PATENT DOCUMENTS

| | | | |
|---|---|---|---|
| 10,520,805 B2* | 12/2019 | Chou | B08B 7/0035 |
| 10,732,124 B2* | 8/2020 | Halder | G01N 21/8851 |
| 2002/0056388 A1* | 5/2002 | Makino | B41C 1/1025 |
| | | | 101/453 |
| 2011/0034106 A1* | 2/2011 | Kimba | B24B 49/12 |
| | | | 451/5 |
| 2017/0123328 A1* | 5/2017 | Liao | G01N 21/8851 |

* cited by examiner

METHOD OF ANALYZING A MANUFACTURING OF A SEMICONDUCTOR STRUCTURE

PRIORITY CLAIM AND CROSS-REFERENCE

This application claims the benefit of provisional application Ser. 62/737,352 filed on Sep. 27, 2018, entitled "METHOD OF ANALYZING A MANUFACTURING OF A SEMICONDUCTOR STRUCTURE," the disclosure of which is hereby incorporated by reference in its entirety.

BACKGROUND

With the advancement of electronic technology, the semiconductor device is becoming increasingly smaller in size while having greater functionality and greater amounts of integrated circuitry. Due to the miniaturized scale of the semiconductor device, a number of semiconductor components are assembled on the semiconductor device. Furthermore, numerous manufacturing operations are implemented within such a small semiconductor device.

Upon fabrication of the semiconductor device, the semiconductor device is observed by various equipments. Further, after one or more stages of the fabrication, various inspections of the semiconductor device are performed. For example, problematic semiconductor device is identified through optical inspection, or the semiconductor device has to undergo a failure analysis to find out defects and causes, so as to improve manufacturing and reliability of the semiconductor device. When the problematic semiconductor device was found, the fabrication of the semiconductor device may have to be temporarily suspended. A cycle time of the fabrication is increased, and a progression of the fabrication is adversely affected.

As such, the fabrication of the semiconductor device may encounter challenges, and there is a continuous need to modify the fabrication of the semiconductor device and improve reliability of the semiconductor device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
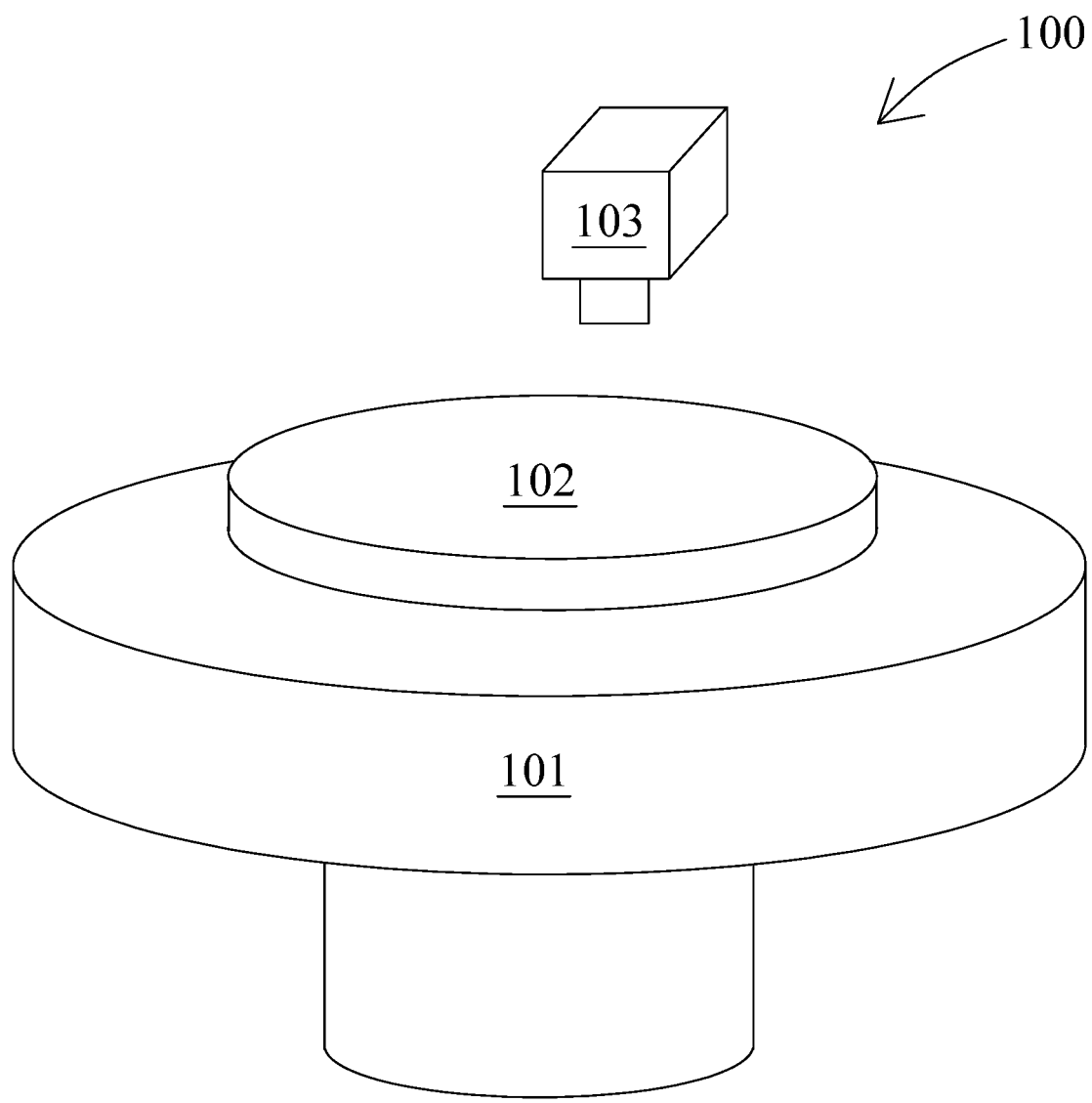
FIG. 1 is a schematic isometric view of an apparatus for monitoring or analyzing a manufacturing of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by numerous operations, and several apparatuses are involved to perform one or more operations for the semiconductor structure. During the manufacturing, the semiconductor structure and the apparatus are monitored by various equipments such as sensor, scanner, detector, camera, etc. For example, images of the semiconductor structure and the apparatus are captured by a camera upon the manufacturing. Further, inspections of the semiconductor structure are performed during the manufacturing or after one or several stages of the manufacturing. The inspections are facilitated to find out defects of the semiconductor structure. For example, a problematic semiconductor structure is identified based on analysis of the images of the semiconductor structure captured by the camera.

However, when the problematic semiconductor structure was found or the apparatus was improperly configured, the manufacturing may have to be temporarily suspended in order to implement an adjustment or improvement of the manufacturing. Such suspension may delay the manufacturing and thus undesirably increase a cycle time of the manufacturing.

In the present disclosure, a method of monitoring or analyzing a manufacturing of a semiconductor structure is disclosed. The method includes providing a semiconductor structure; providing a camera disposed around the semiconductor structure; disposing a liquid substance over the semiconductor structure; removing the liquid substance from the semiconductor structure; capturing a plurality of first images of the semiconductor structure by the camera; analyzing the plurality of first images; identifying a region of the semiconductor structure where a residue of the liquid substance is disposed based on the analysis of the plurality of first images; and performing a response based on the identification of the region of the semiconductor structure. A response such as removal of the residue of the liquid substance would be performed when the residue was detected. Therefore, manufacturing of the semiconductor structure can be adjusted or improved once a defect in the semiconductor structure was found.

Further, a method of monitoring or analyzing a manufacturing of a semiconductor structure is disclosed. The method includes providing a semiconductor structure; providing a camera disposed around the semiconductor structure; disposing a liquid substance over a surface of the semiconductor structure; capturing a plurality of images of the surface of the semiconductor structure and the liquid substance by the camera; deriving a physical property of the surface of the semiconductor structure based on the plurality of images captured by the camera; identifying an abnormal region of the surface of the semiconductor structure based on the deriving of the physical property of the surface of the semiconductor structure; and performing a response based on the identification of the abnormal region of the surface of the semiconductor structure. The physical property of the surface of the semiconductor structure can be derived through images analysis. Therefore, a problematic semiconductor structure can be identified. The manufacturing of the semiconductor structure would be adjusted once the problematic semiconductor structure was found.

Further, a method of monitoring or analyzing a manufacturing of a semiconductor structure is disclosed. The method includes providing a semiconductor structure; providing a camera disposed around the semiconductor structure; providing a first nozzle disposed over the semiconductor structure; providing a second nozzle disposed over the semiconductor structure; disposing a first liquid substance from the first nozzle towards the semiconductor structure in a first flow rate; capturing a plurality of first images including the first nozzle and the first liquid substance flowed out from the first nozzle, and a plurality of second images including the second nozzle or a second liquid substance leaked out from the second nozzle by the camera; analyzing the plurality of first images and the plurality of second images; identifying the leakage of the second liquid substance from the second nozzle towards the semiconductor structure in a second flow rate based on the analysis of the plurality of first images and the plurality of second images; and performing a response based on the identification of the leakage of the second liquid substance from the second nozzle, wherein the second flow rate is substantially slower than the first flow rate. Leakage of the liquid substance from the nozzle can be identified through images analysis. Therefore, adjustment of the nozzle would be performed once the leakage was detected.

FIG. 1 is a schematic view of a first apparatus 100 in accordance with various embodiments of the present disclosure. In some embodiments, the first apparatus 100 includes a stage 101, a semiconductor structure 102 and a camera 103. In some embodiments, the first apparatus 100 is configured to perform an operation for the semiconductor structure 102. In some embodiments, the first apparatus 100 is configured to perform one or more operations such as cleaning, drying, etching, polishing, spinning, etc.

In some embodiments, the stage 101 is configured to hold the semiconductor structure 102. In some embodiments, the stage 101 is rotatable. In some embodiments, the stage 101 is rotatable relative to the camera 103.

In some embodiments, the semiconductor structure 102 is disposed on the stage 101. In some embodiments, the semiconductor structure 102 is attached to the stage 101. In some embodiments, the semiconductor structure 102 is a substrate, a wafer, a package or the like. In some embodiments, the semiconductor structure 102 includes several dies or packages disposed coplanar with or stacking over each other. In some embodiments, the semiconductor structure 102 includes semiconductive materials such as silicon or other suitable materials. In some embodiments, the semiconductor structure 102 includes a circuitry. In some embodiments, the semiconductor structure 102 includes electrical components and conductive lines connecting the electrical components.

In some embodiments, the camera 103 is disposed around the semiconductor structure 102 or the stage 101. In some embodiments, the camera 103 is disposed above the semiconductor structure 102. In some embodiments, the camera 103 is movable relative to the semiconductor structure 102 or the stage 101.

In some embodiments, the camera 103 is configured to capture an image of the semiconductor structure 102. In some embodiments, the camera 103 is configured to receive an electromagnetic radiation reflected from the semiconductor structure 102 to obtain the image of the semiconductor structure 102. In some embodiments, an image of component or structural configuration inside the semiconductor structure 102 can be captured by the camera 103. In some embodiments, the camera 103 is configured to receive the electromagnetic radiation such as visible light, infrared (IR), ultraviolet (UV), x ray, etc. In some embodiments, the camera 103 is an IR camera.

In some embodiments, the camera 103 is configured to capture several images of the semiconductor structure 102 within a period of time. In some embodiments, the camera 103 is a high speed camera which can capture at least 1000 images of the semiconductor structure 102 per second. In some embodiments, a shutter speed of the camera 103 is about $1/1000$ second to about $1/5000$ second. In some embodiments, the shutter speed is about $1/3000$ second. In some embodiments, the camera 103 is a video camera which can capture the image of the semiconductor structure 102 in motion upon the manufacturing of the semiconductor structure 102.

Figure 2:
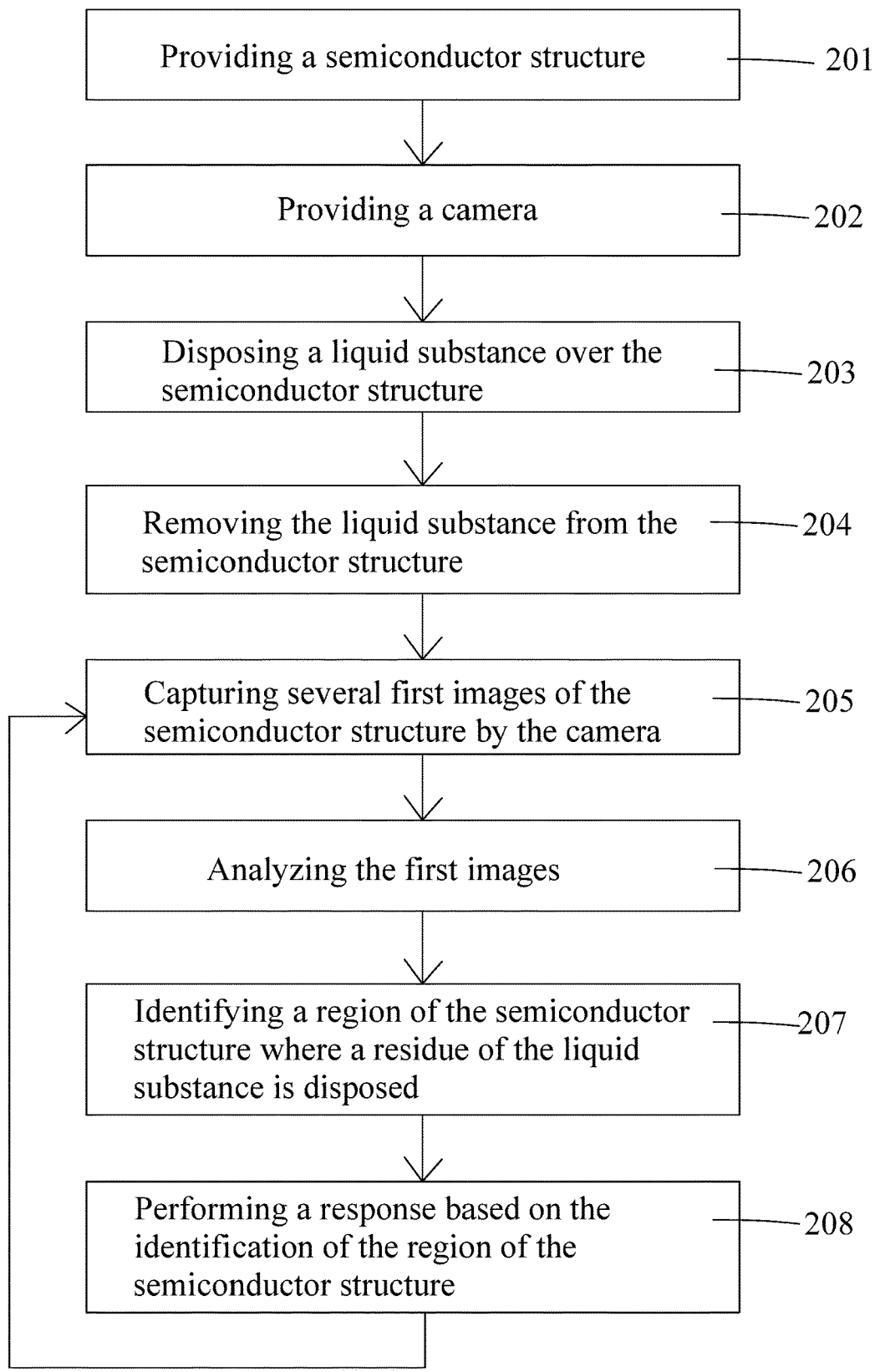
FIG. 2 is a flow diagram of a method of monitoring or analyzing a manufacturing of a semiconductor structure in accordance with some embodiments of the present disclosure.

In the present disclosure, a method of monitoring or analyzing a manufacturing of a semiconductor structure is disclosed. A method 200 includes a number of operations and the description and illustration are not deemed as a limitation as the sequence of the operations. FIG. 2 is an embodiment of the method 200 of monitoring or analyzing the manufacturing of the semiconductor structure 102. The method 200 includes a number of operations (201, 202, 203, 204, 205, 206, 207 and 208).

Figure 3:
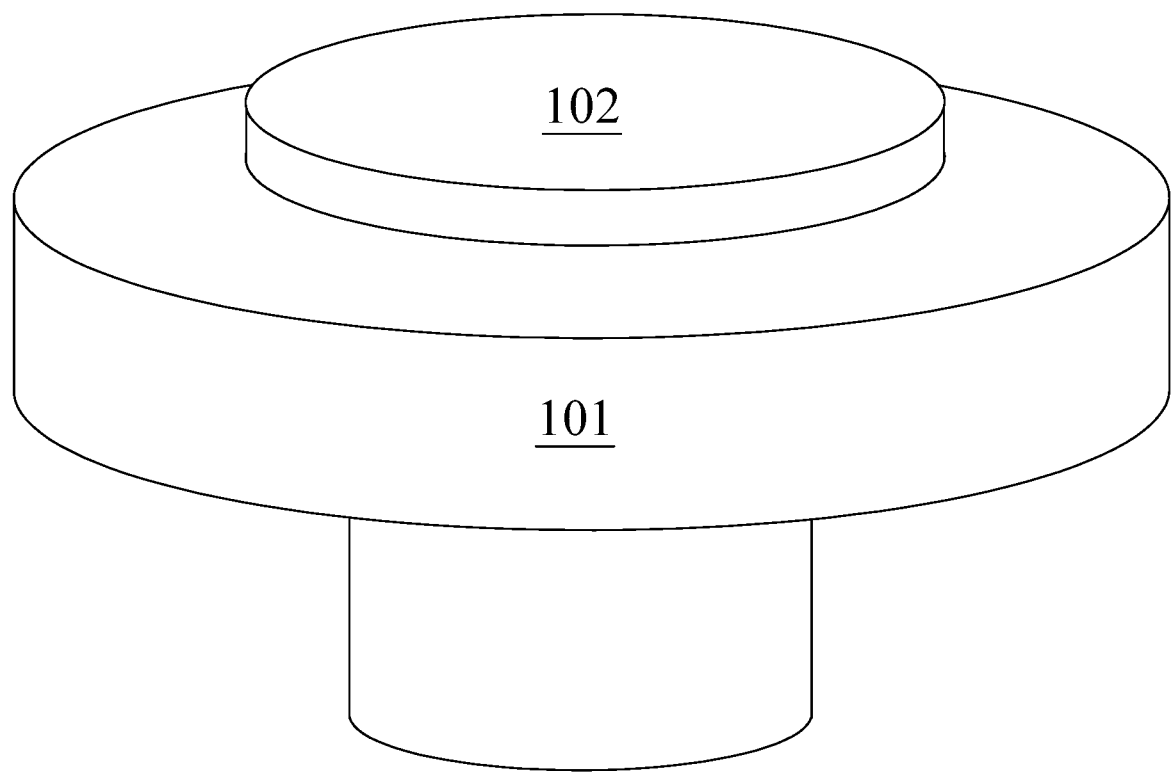
FIGS. 3-12 are schematic views of monitoring or analyzing a manufacturing of a semiconductor structure by a method of FIG. 2 in accordance with some embodiments of the present disclosure.

In operation 201, the semiconductor structure 102 is provided or received as shown in FIG. 3. In some embodiments, the semiconductor structure 102 is loaded on a stage 101. In some embodiments, the semiconductor structure 102 is attached to the stage 101. In some embodiments, the semiconductor structure 102 is a substrate, a wafer, a die or a package. In some embodiments, the semiconductor structure 102 includes a circuitry thereon. In some embodiments, the semiconductor structure 102 includes several electrical components and several conductive lines connecting the electrical components. In some embodiments, the stage 101 and the semiconductor structure 102 are in configurations as those described above or shown in FIG. 1.

Figure 4:
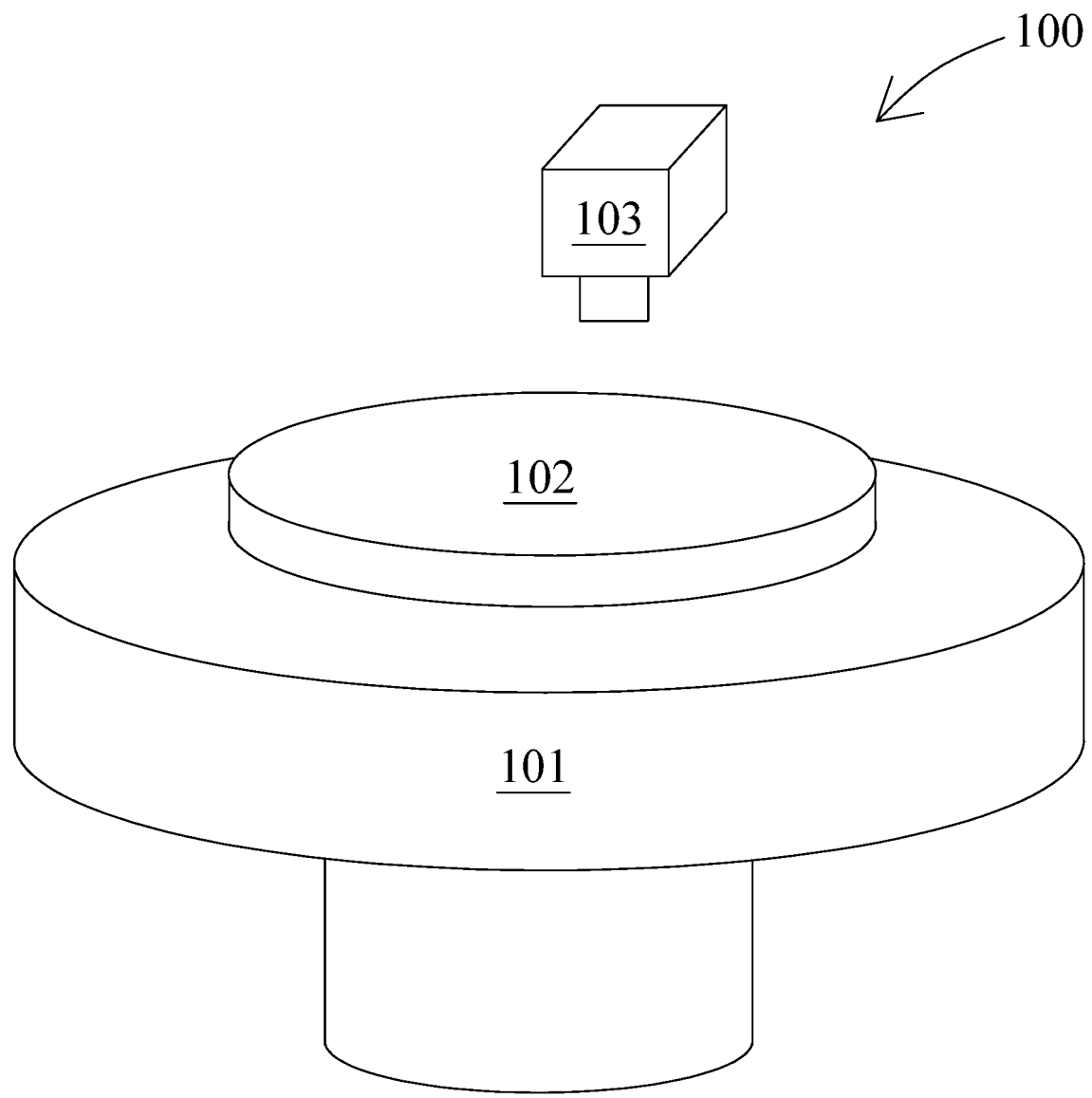

In operation 202, a camera 103 is provided as shown in FIG. 4. In some embodiments, the camera 103 is installed around the semiconductor structure 102. In some embodiments, the camera 103 is installed above the semiconductor structure 102. In some embodiments, the camera 103 is movable relative to the semiconductor structure 102 or the stage 101. In some embodiments, the camera 103 is configured to capture an image of the semiconductor structure 102. In some embodiments, the camera 103 is in configuration as those described above or shown in FIG. 1. In some embodiments, some of operations of the method 200 are implemented by the first apparatus 100. In some embodiments, the first apparatus 100 is in configuration as described above or shown in FIG. 1.

Figure 5:
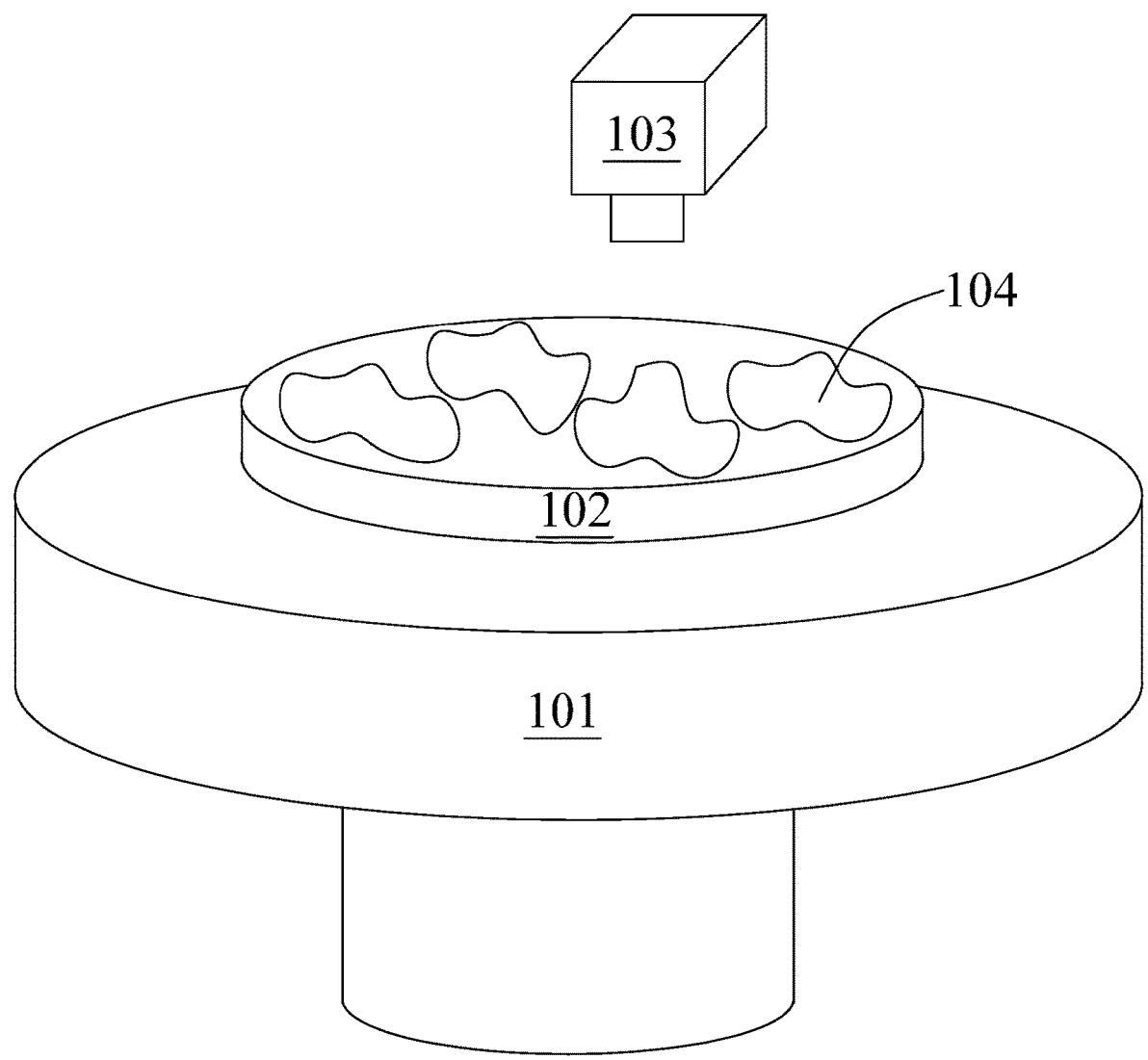
Figure 6:
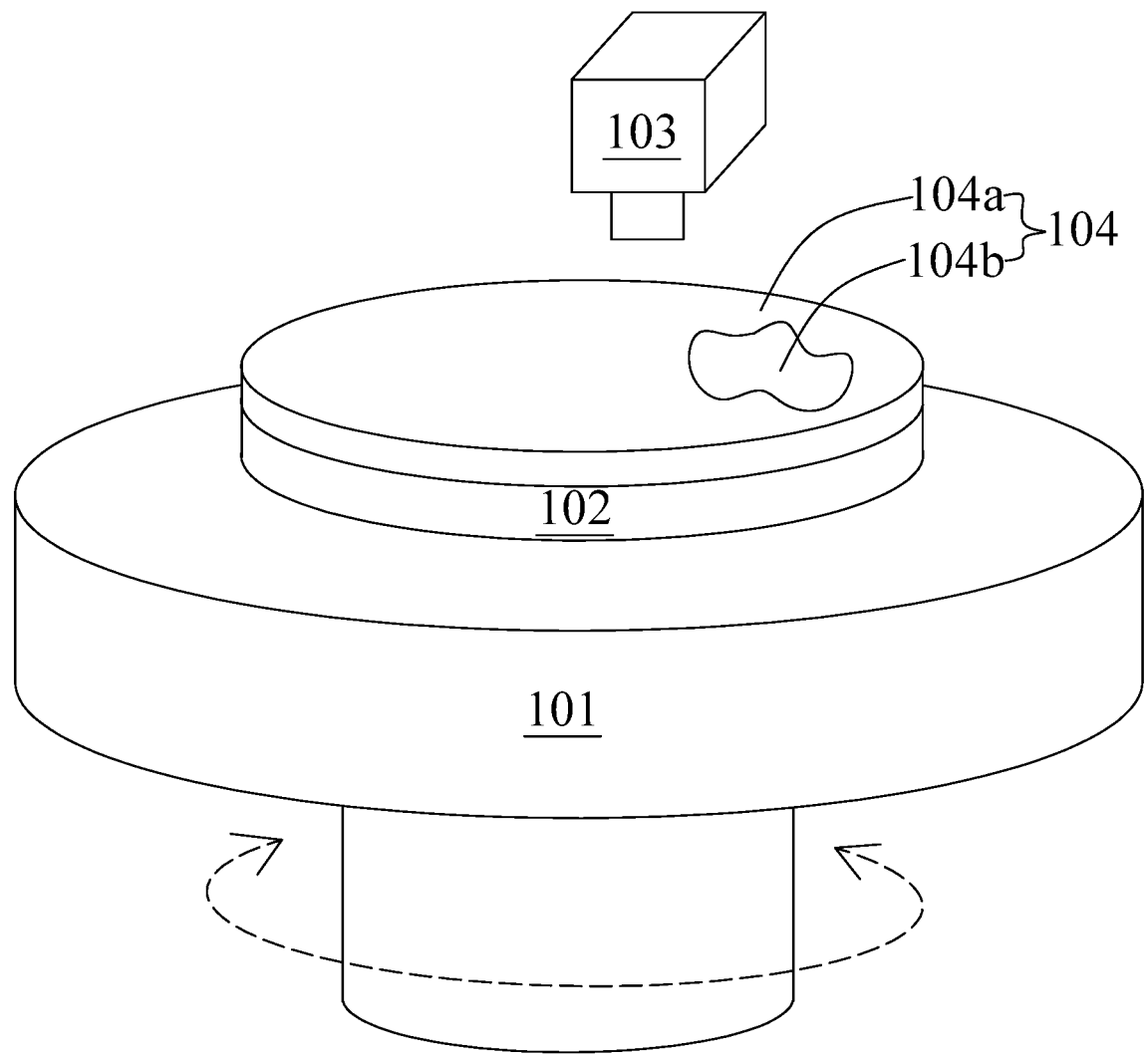

In operation 203, a liquid substance 104 is disposed over the semiconductor structure 102 as shown in FIGS. 5 and 6. In some embodiments, the liquid substance 104 is discharged from an outlet or a nozzle.

In some embodiments as shown in FIG. 5, the liquid substance 104 is disposed over the semiconductor structure 102 to clean the semiconductor structure 102. In some embodiments, the liquid substance 104 is configured to clean the semiconductor structure 102. In some embodiments, the liquid substance 104 is water, deionized water, chloroform or the like. In some embodiments, the semiconductor structure 102 is cleaned by spraying the liquid substance 104 over the semiconductor structure 102.

In some embodiments, the semiconductor structure 102 is cleaned by rinsing in a reservoir containing the liquid substance 104. In some embodiments, the liquid substance 104 is disposed over some portions of the semiconductor structure 102 after withdrawn of the semiconductor structure 102 from the reservoir or accomplishment of the cleaning operations. In some embodiments, the semiconductor structure 102 is loaded back to the stage 101 after the cleaning operations.

In some embodiments as shown in FIG. 5, the liquid substance 104 is disposed over the semiconductor structure 102 to facilitate a removal of a portion of the semiconductor structure 102. In some embodiments, the removal of the portion of the semiconductor structure 102 is performed after the disposing of the liquid substance 104. In some embodiments, the portion of the semiconductor structure 102 is removed by wet etching, chemical mechanical polishing (CMP) or any other suitable operations. In some embodiments, the liquid substance 104 is a liquid etchant, slurry, chemical or the like.

In some embodiments, the portion of the semiconductor structure 102 is removed by immersing the semiconductor structure 102 into the reservoir containing the liquid substance 104 over a period of time, and then withdrawing from the reservoir. In some embodiments, the liquid substance 104 is disposed over some portions of the semiconductor structure 102 after withdrawn of the semiconductor structure 102 from the reservoir or accomplishment of the removal operations. In some embodiments, the semiconductor structure 102 is loaded back to the stage 101 after the removal operations.

In some embodiments as shown in FIG. 6, the liquid substance 104 is disposed over the semiconductor structure 102 to form a coating 104*a* on a surface of the semiconductor structure 102. In some embodiments, the coating 104*a* is formed by disposing the liquid substance 104 over the semiconductor structure 102 and spinning the semiconductor structure 102. In some embodiments, the spinning is performed by rotating the stage 101 (arrow). In some embodiments, the liquid substance 104 is a photoresist (PR), dielectric material or the like. In some embodiments, some excessive liquid substance 104*b* is disposed over the coating 104*a* after the formation of the coating 104*a* on the semiconductor structure 102.

Figure 7:
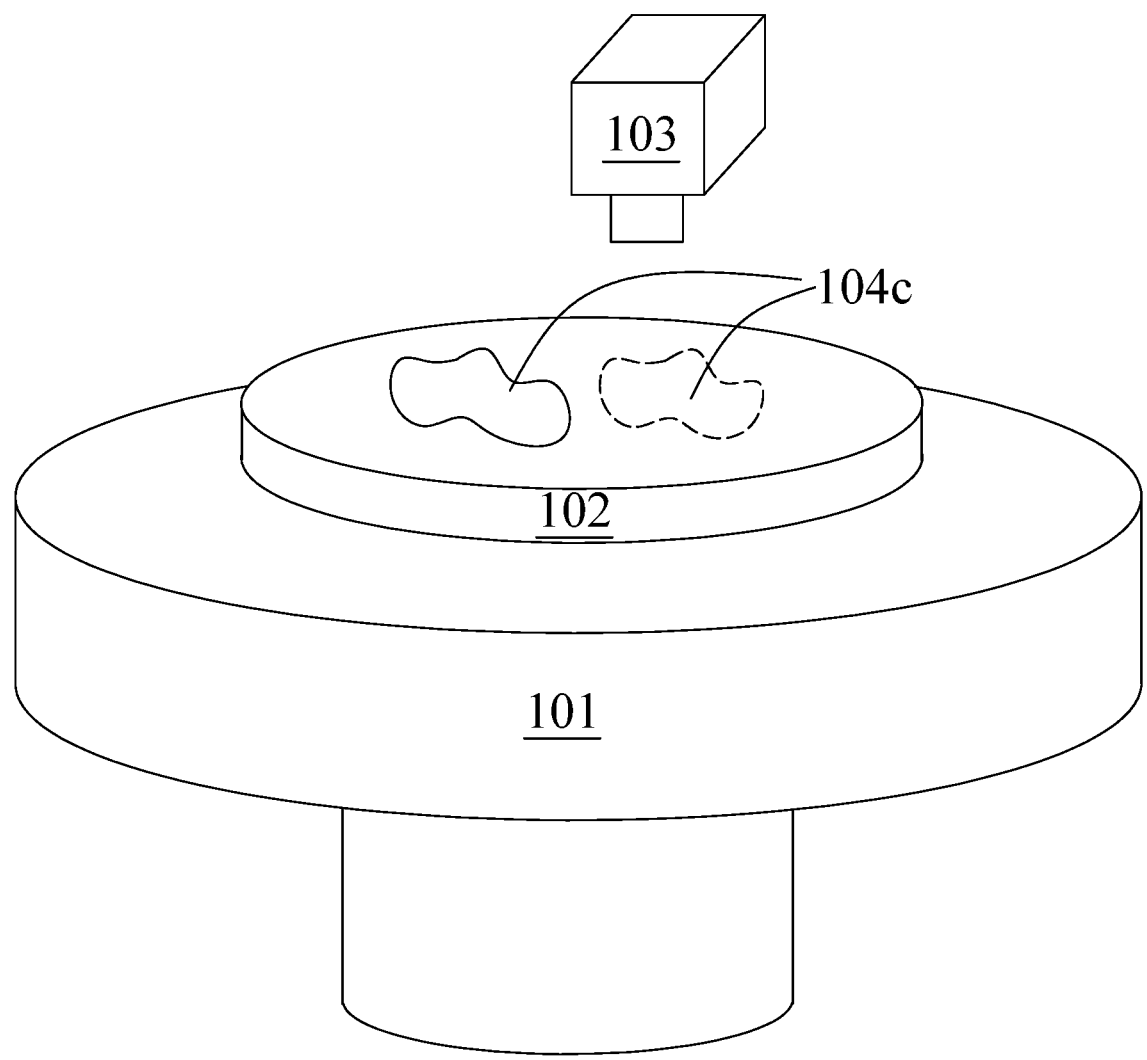
Figure 8:
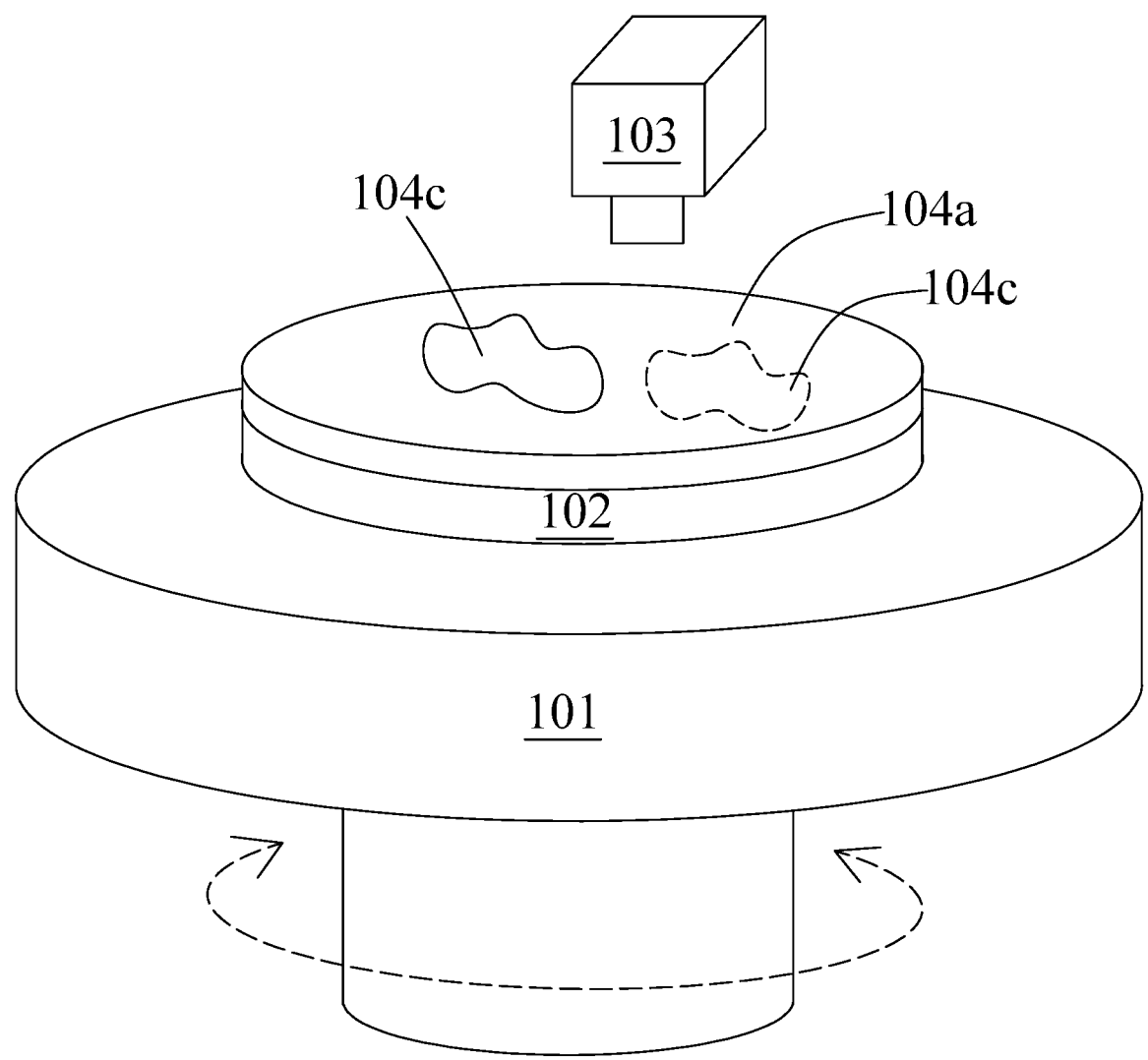

In operation 204, the liquid substance 104 is removed from the semiconductor structure 102 as shown in FIGS. 7 and 8. In some embodiments, the liquid substance 104 is removed by blowing, drying, baking, spin drying, etc.

In some embodiments, after the cleaning or removal operations (FIG. 5), the liquid substance 104 is removed from the semiconductor structure 102 by blowing, drying or baking. However, as shown in FIG. 7, a residue 104*c* of the liquid substance 104 is still disposed over or within the semiconductor structure 102 after the removal of the liquid substance 104. In some embodiments, the residue 104*c* of the liquid substance 104 is disposed over a surface of the semiconductor structure 102 or within a recess of the semiconductor structure 102 indented into the semiconductor structure 102. In some embodiments, the residue 104*c* of the liquid substance 104 is trapped by the recess of the semiconductor structure 102.

In some embodiments, after the formation of the coating 104*a* on the semiconductor structure 120 (FIG. 6), the excessive liquid substance 104*b* is removed from the semiconductor structure 102 by spin drying (arrow). However, as shown in FIG. 8, the residue 104*c* of the liquid substance 104 is still disposed over or within the semiconductor structure 102 after the removal of the excessive liquid substance 104*b*. In some embodiments, the residue 104*c* of the liquid substance 104 is disposed over the coating 104*a* of the semiconductor structure 102 or within a recess of the semiconductor structure 102 indented into the semiconductor structure 102. In some embodiments, the residue 104*c* of the liquid substance 104 is trapped by the recess of the semiconductor structure 102.

In operation 205, several first images of the semiconductor structure 102 are captured by the camera 103 as shown in FIGS. 7 and 8. In some embodiments, the first images of the semiconductor structure 102 are captured after the removal of the liquid substance 104 (the operation 204). In some embodiments, an electromagnetic radiation such as visible light, IR, UV, etc. from the semiconductor structure 102 and the residue 104*c* of the liquid substance 104 is received by the camera 103 to obtain the first images. In some embodiments, the electromagnetic radiation is transmitted towards the semiconductor structure 102 and then is received from the semiconductor structure 102 and the residue 104*c* of the liquid substance 104 by the camera 103 to obtain the first images.

In operation 206, the first images are analyzed. In some embodiments, the first images captured by the camera 103 are analyzed by image recognition system or the like. In some embodiments, the first images are analyzed after the removal of the liquid substance 104 (the operation 204).

Figure 9:
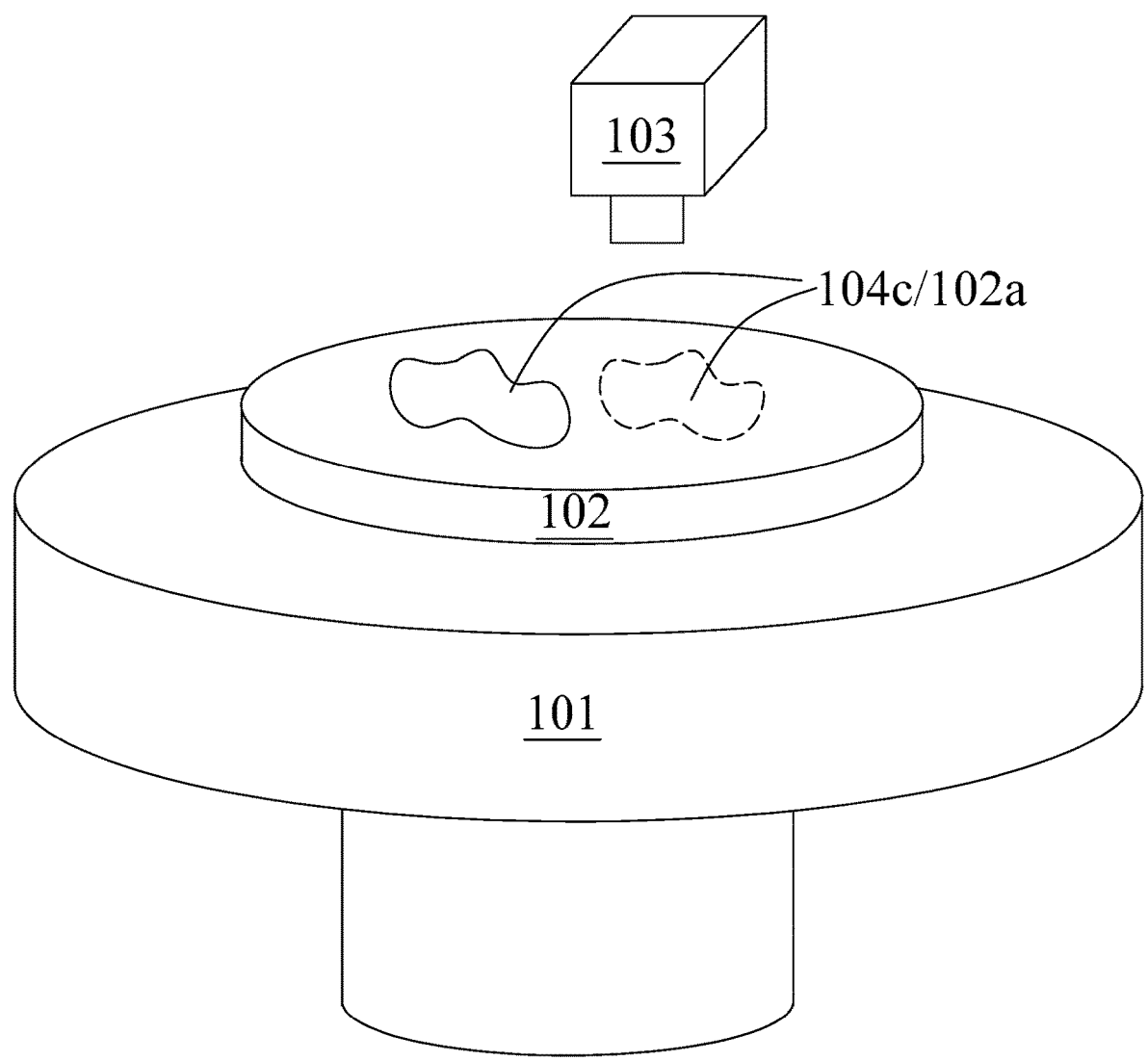
Figure 10:
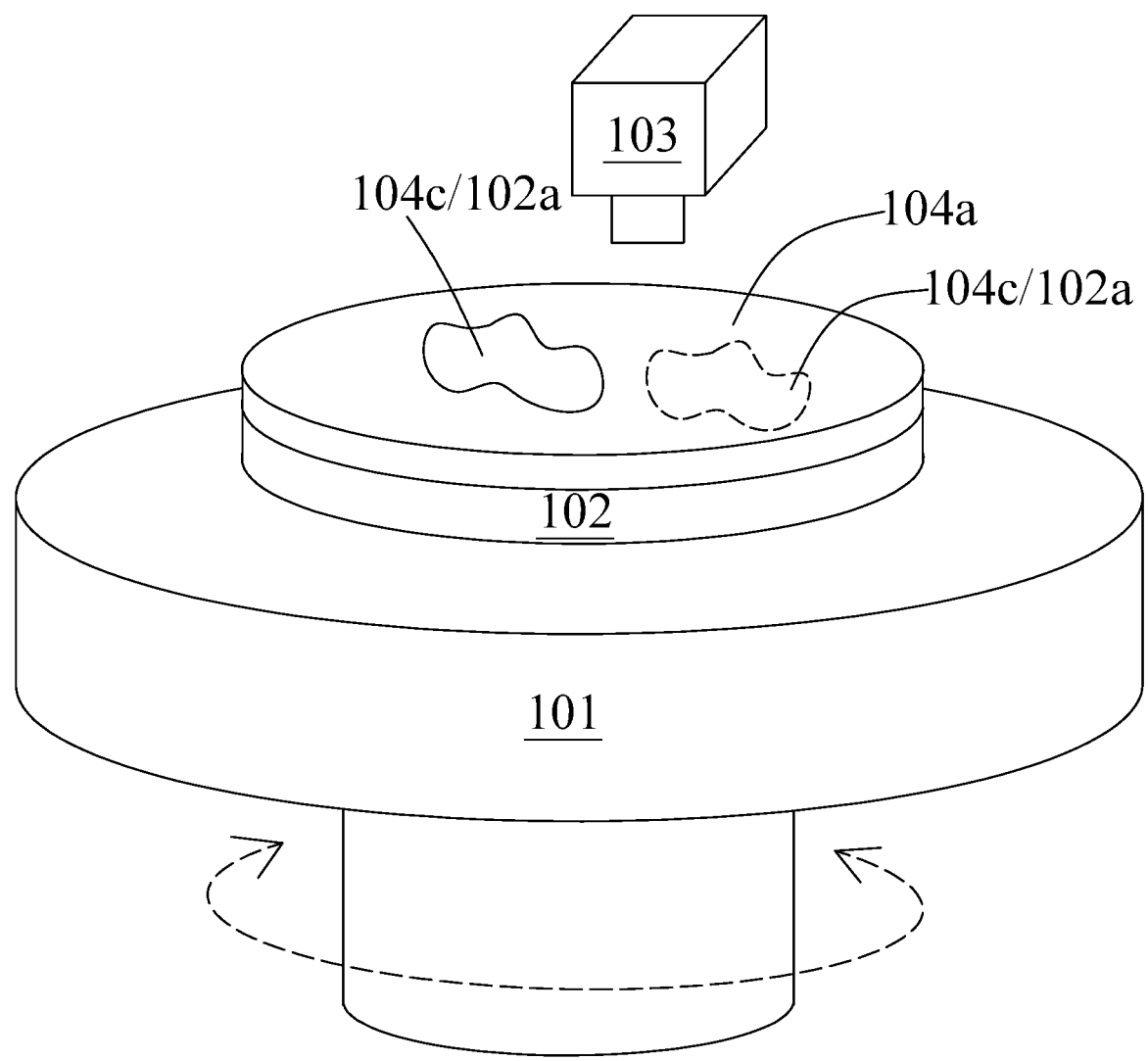

In operation 207, a region 102*a* of the semiconductor structure 102 is identified based on the analysis of the first images (the operation 206) as shown in FIGS. 9 and 10. In some embodiments, the residue 104*c* of the liquid substance 104 is disposed at the region 102a of the semiconductor structure 102. In some embodiments, the region 102a of the semiconductor structure 102 is identified after the removal of the liquid substance 104 (the operation 204). In some embodiments, a signal is generated when the region 102a is identified. In some embodiments, the region 102a is disposed inside the semiconductor structure 102.

Figure 11:
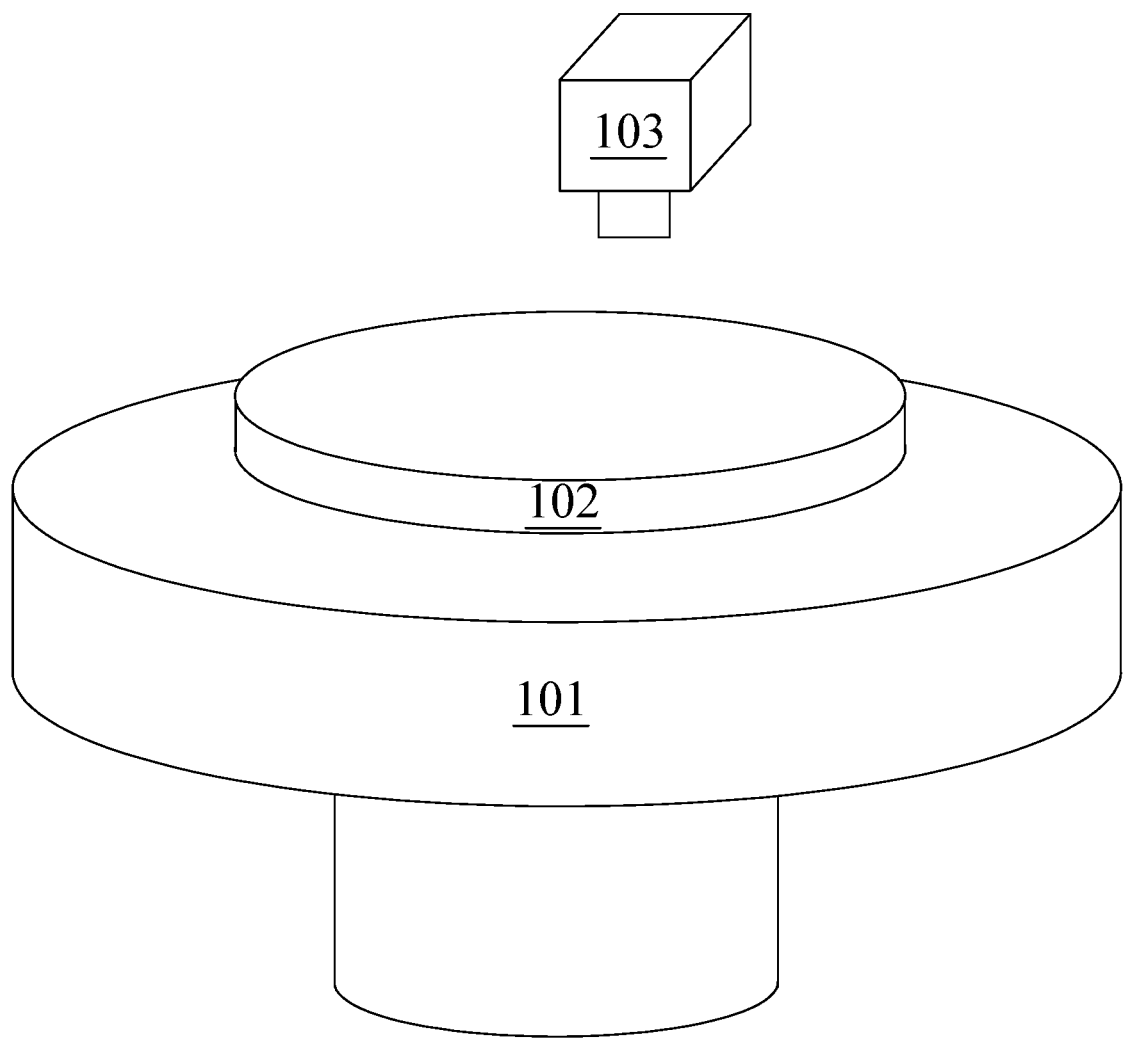
Figure 12:
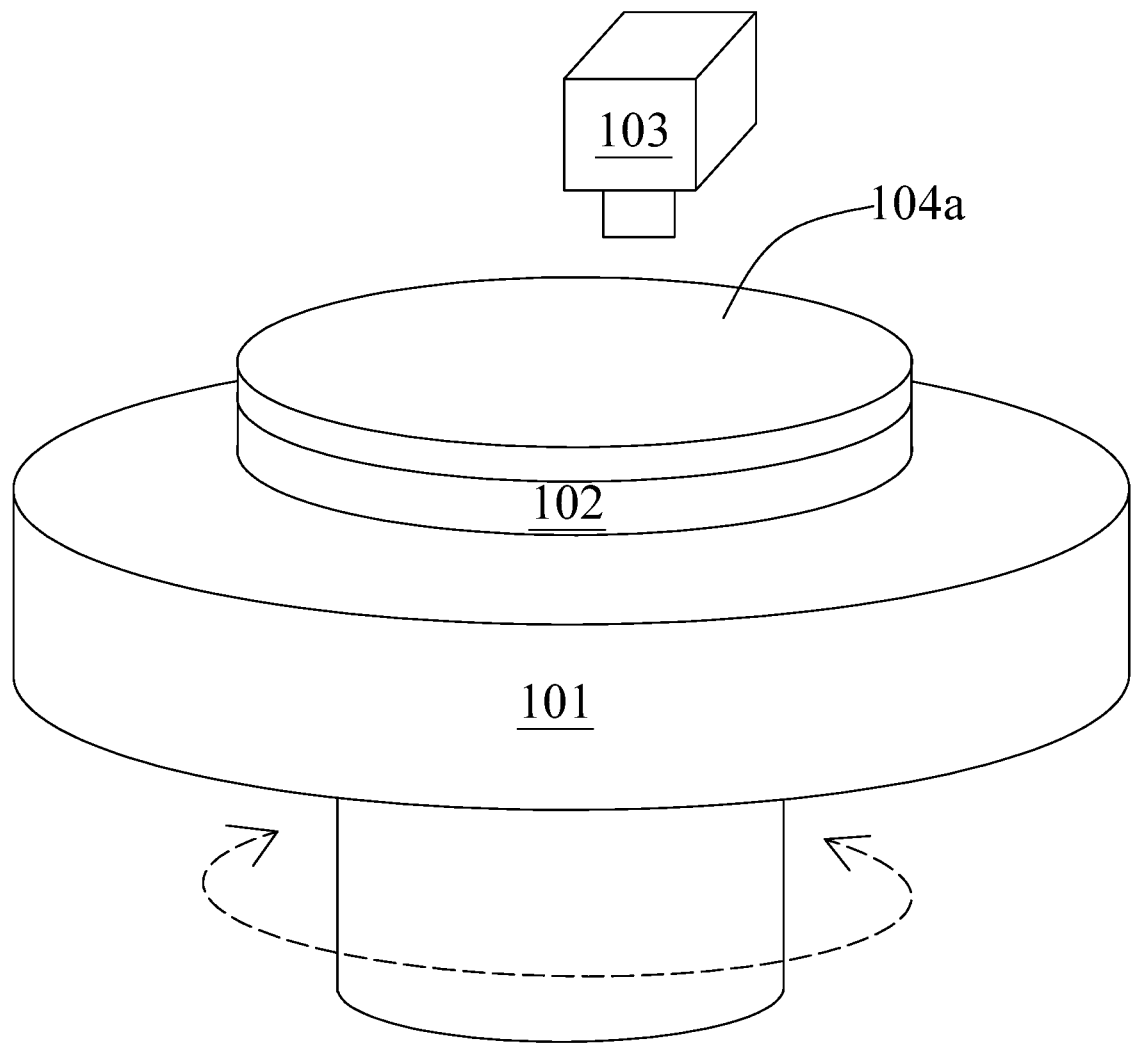

In operation 208, a response is performed based on the identification of the region 102a of the semiconductor structure 102 as shown in FIGS. 11 and 12. In some embodiments, the response is performed after the removal of the liquid substance 104 (the operation 204). In some embodiments, the response is performed immediately after the identification of the region 102a (the operation 207). As such, a real time feedback is generated after identification of the region 102a, and a real time response is performed based on the real time feedback. In some embodiments, the response (such as the removal of the residue 104c) is performed once the region 102a of the semiconductor structure 102 is identified.

In some embodiments, the performance of the response includes removing the residue 104c of the liquid substance 104 from the semiconductor structure 102. In some embodiments, the removal of the residue 104c includes blowing, drying, baking, spin drying, etc. In some embodiments as shown in FIGS. 11 and 12, the residue 104c of the liquid substance 104 is absent from the semiconductor structure 102 after the performance of the response. In some embodiments, after the removal of the residue 104c of the liquid substance 104 from the semiconductor structure 102 (the operation 208), several second images of the semiconductor structure 102 are captured by the camera 103 and are analyzed.

In some embodiments, the residue 104c of the liquid substance 104 is still present over the semiconductor structure 102 after the removal of the residue 104c (the operation 208), that is, the residue 104c can still be identified based on the analysis of the second images. In some embodiments, the response is performed again if the residue 104c is still present over the semiconductor structure 102 after the removal of the residue 104c (the operation 208). In some embodiments, the response is performed until the residue 104c is absent from the semiconductor structure 102 (or the region 102a of the semiconductor structure 102 cannot be identified).

In some embodiments, the performance of the response includes adjusting at least one of parameters associated with the removal of the liquid substance 104 from the semiconductor structure 102. In some embodiments, the parameters such as temperature, rotational speed, duration, etc. are adjusted, and then the removal of the residue 104c of the liquid substance 104 from the semiconductor structure 102 is performed based on the adjustment of the at least one of parameters.

In some embodiments as shown in FIGS. 11 and 12, the residue 104c of the liquid substance 104 is absent from the semiconductor structure 102 after the adjustment of the at least one of parameters and the removal of the residue 104c based on the adjustment. In some embodiments, after the removal of the residue 104c of the liquid substance 104 from the semiconductor structure 102 (the operation 208), several second images of the semiconductor structure 102 are captured by the camera 103 and are analyzed.

In some embodiments, the residue 104c of the liquid substance 104 is still present over the semiconductor structure 102 after the removal of the residue 104c based on the adjustment (the operation 208), that is, the residue 104c can still be identified based on the analysis of the second images. In some embodiments, the response is performed again if the residue 104c is still present over the semiconductor structure 102 after the removal of the residue 104c based on the adjustment (the operation 208). In some embodiments, at least one of the parameters is adjusted again and the removal of the residue 104c is performed again based on the latest adjustment. In some embodiments, the response is performed until the residue 104c is absent from the semiconductor structure 102 (or the region 102a of the semiconductor structure 102 cannot be identified).

Figure 13:
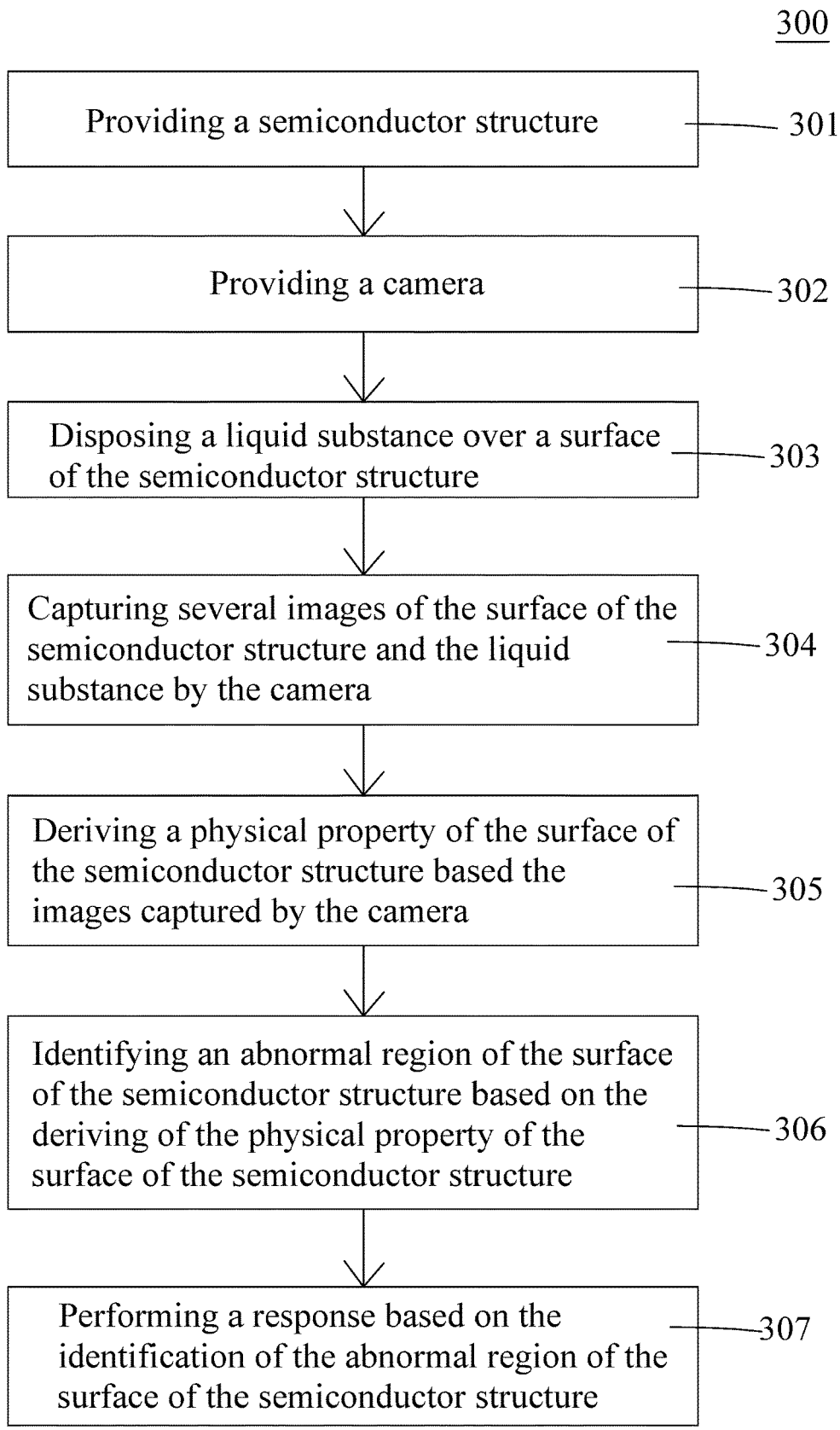
FIG. 13 is a flow diagram of a method of monitoring or analyzing a manufacturing of a semiconductor structure in accordance with some embodiments of the present disclosure.

In the present disclosure, a method of monitoring or analyzing a manufacturing of a semiconductor structure is disclosed. A method 300 includes a number of operations and the description and illustration are not deemed as a limitation as the sequence of the operations. FIG. 13 is an embodiment of the method 300 of monitoring or analyzing the manufacturing of the semiconductor structure 102. The method 300 includes a number of operations (301, 302, 303, 304, 305, 306 and 307).

Figure 14:
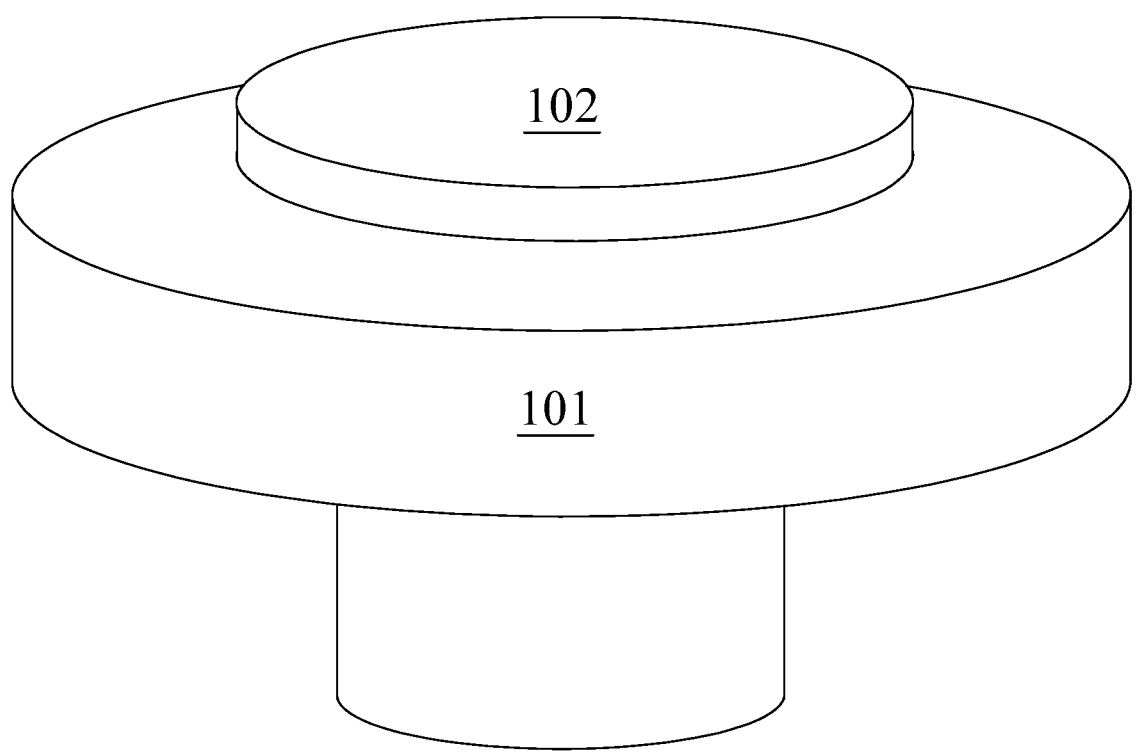
FIGS. 14-17 are schematic views of monitoring or analyzing a manufacturing of a semiconductor structure by a method of FIG. 13 in accordance with some embodiments of the present disclosure.

In operation 301, the semiconductor structure 102 is provided or received as shown in FIG. 14. In some embodiments, the operation 301 is substantially the same as the operation 201.

Figure 15:
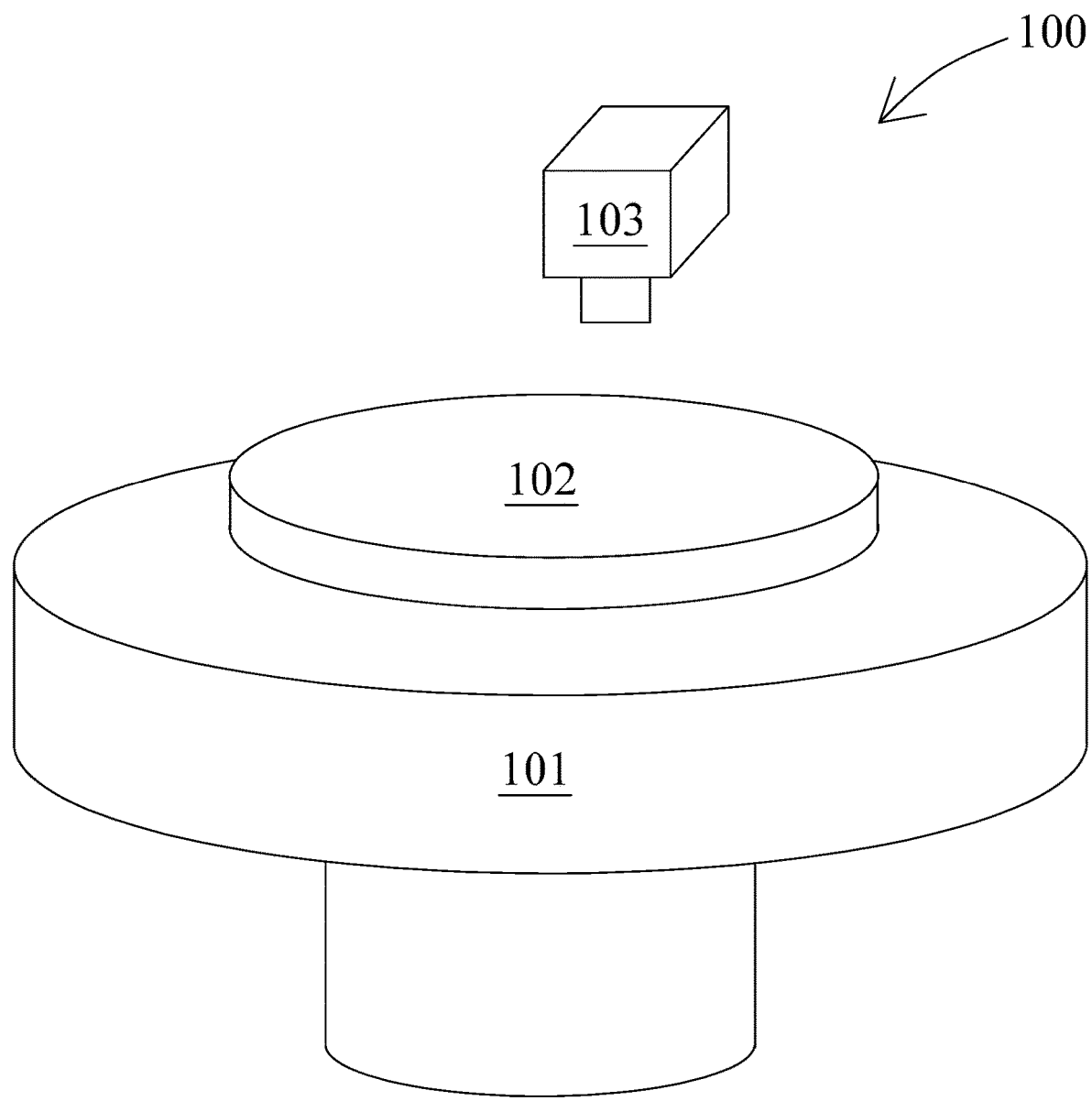

In operation 302, the camera 103 is provided as shown in FIG. 15. In some embodiments, the camera 103 is a high speed camera and configured to capture at least 1000 images of a surface of the semiconductor structure per second. In some embodiments, the operation 302 is substantially the same as the operation 202.

Figure 16:
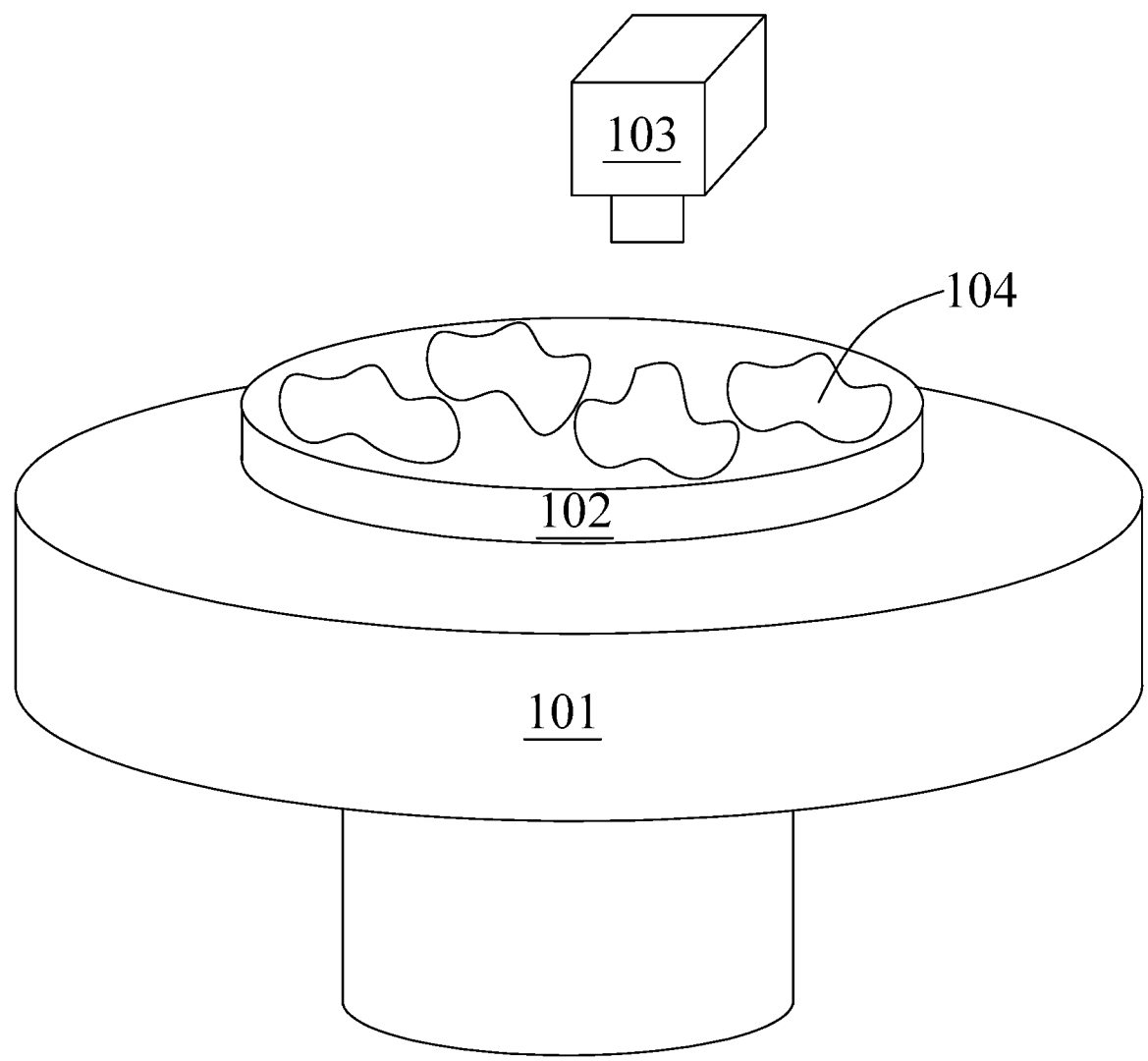

In operation 303, a liquid substance 104 is disposed over a surface of the semiconductor structure 102 as shown in FIG. 16. In some embodiments, the liquid substance 104 is discharged from an outlet or a nozzle towards the surface of the semiconductor structure 102. In some embodiments, the liquid substance 104 is water or the like. In some embodiments, the liquid substance 104 is disposed by spraying, spinning or any other suitable operations.

In operation 304, several images of the surface of the semiconductor structure 102 are captured by the camera 103 as shown in FIG. 16. In some embodiments, the images of the surface the semiconductor structure 102 and the liquid substance 104 are captured after the disposing of the liquid substance 104 (the operation 303). In some embodiments, an electromagnetic radiation such as visible light, IR, UV, etc. from the semiconductor structure 102 and the liquid substance 104 is received by the camera 103 to obtain the images. In some embodiments, the electromagnetic radiation is transmitted towards the semiconductor structure 102 and then is received from the semiconductor structure 102 and the liquid substance 104 by the camera 103 to obtain the images.

In operation 305, a physical property of the surface of the semiconductor structure 102 is derived based on the images captured by the camera 103. In some embodiments, the images are analyzed to derive the physical property of the surface of the semiconductor structure 102. In some embodiments, the images captured by the camera 103 are analyzed by image recognition system or the like. In some embodiments, the physical property of the surface of the semiconductor structure 102 is derived by analyzing a pattern or distribution of the liquid substance 104 over the surface of the semiconductor structure 102 shown in the images. In some embodiments, the physical property of the surface such as hydrophobicity, hydrophilicity, etc. can be derived by the analysis of the images.

Figure 17:
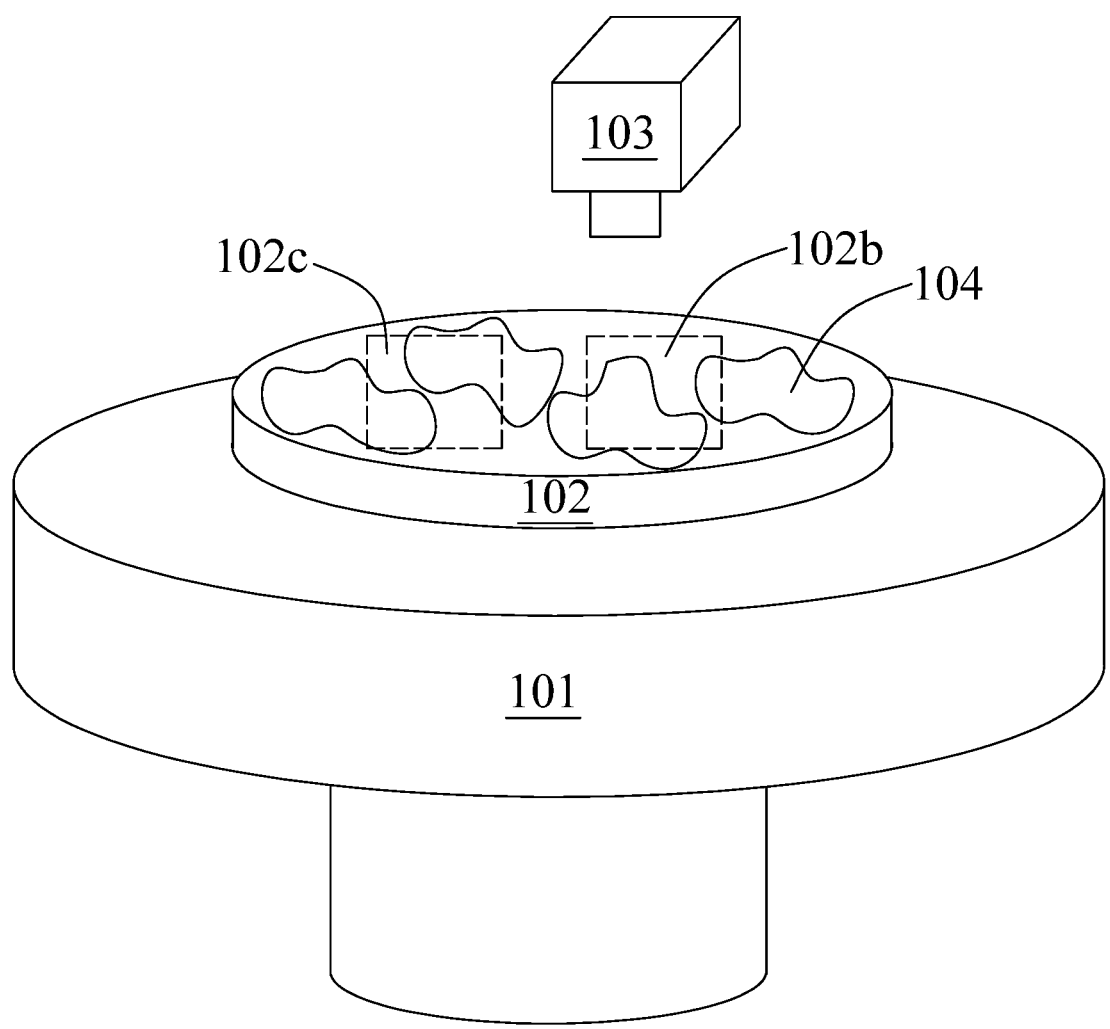

In operation 306, an abnormal region 102b of the surface of the semiconductor structure 102 is identified based on the deriving of the physical property of the surface of the semiconductor structure 102 as shown in FIG. 17. In some embodiments, the abnormal region 102b of the surface of the semiconductor structure 102 is hydrophobic. In some embodiments, a region of the surface of the semiconductor structure 102 is identified as the abnormal region 102b if the region of the surface is hydrophobic derived from the analysis of the images captured by the camera 103.

In some embodiments, a normal region 102c of the surface of the semiconductor structure 102 based on the deriving of the physical property of the surface of the semiconductor structure 102 is also identified as shown in FIG. 17. In some embodiments, the normal region 102c of the surface of the semiconductor structure 102 is hydrophilic. In some embodiments, a region of the surface of the semiconductor structure 102 is identified as the normal region 102c if the region of the surface is hydrophilic derived from the analysis of the images captured by the camera 103.

In operation 307, a response is performed based on the identification of the abnormal region 102b of the surface of the semiconductor structure 102. In some embodiments, the response is performed immediately after the identification of the abnormal region 102b of the surface of the semiconductor structure 102 (the operation 306). As such, a real time feedback is generated after identification of the abnormal region 102b, and a real time response is performed based on the real time feedback.

In some embodiments, the response is performed once the abnormal region 102b of the surface of the semiconductor structure 102 is identified. In some embodiments, the performance of the response includes terminating the manufacturing of the semiconductor structure 102, unloading the semiconductor structure 102 from the stage 101, or any other suitable responses.

Figure 18:
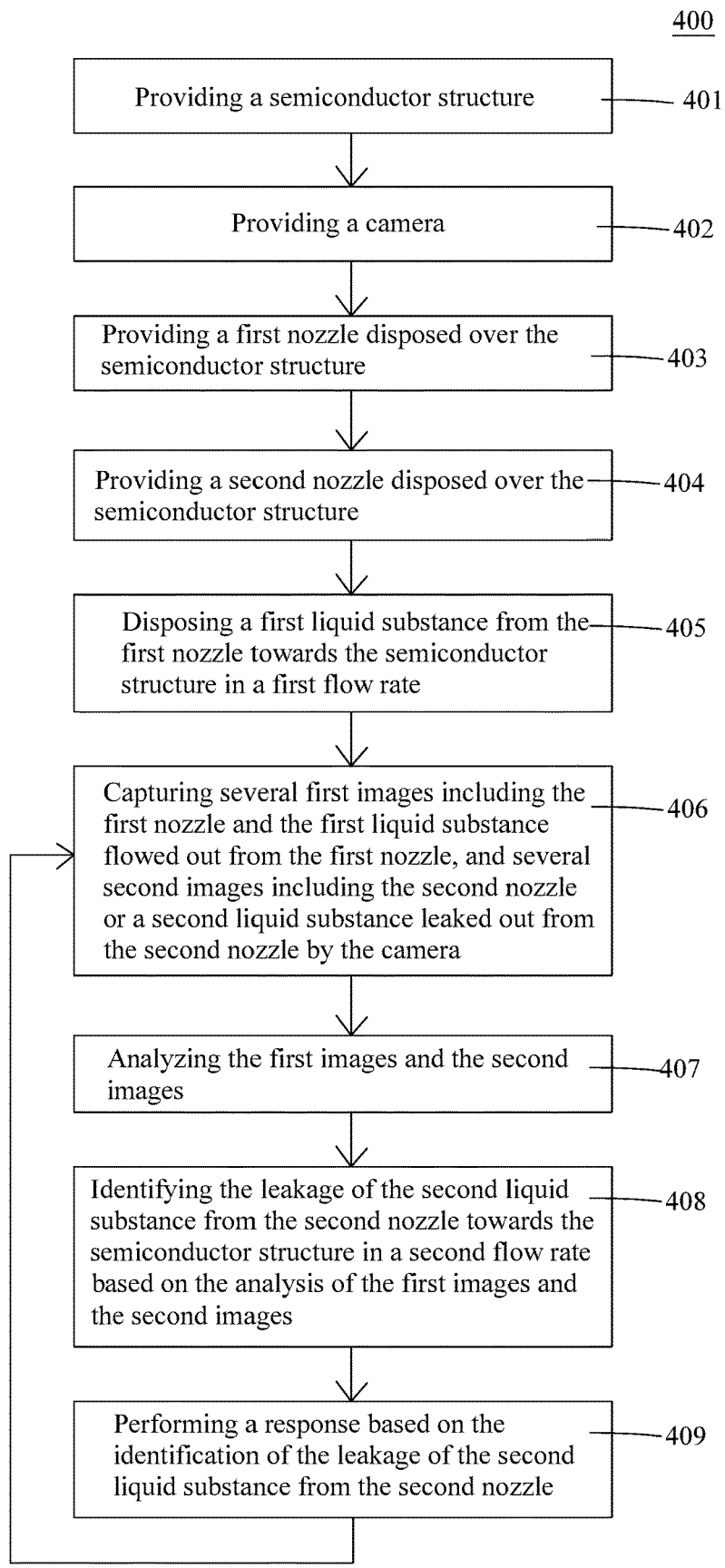
FIG. 18 is a flow diagram of a method of monitoring or analyzing a manufacturing of a semiconductor structure in accordance with some embodiments of the present disclosure.

In the present disclosure, a method of monitoring or analyzing a manufacturing of a semiconductor structure is disclosed. A method 400 includes a number of operations and the description and illustration are not deemed as a limitation as the sequence of the operations. FIG. 18 is an embodiment of the method 400 of monitoring or analyzing the manufacturing of the semiconductor structure 102. The method 400 includes a number of operations (401, 402, 403, 404, 405, 406, 407, 408 and 409).

Figure 19:
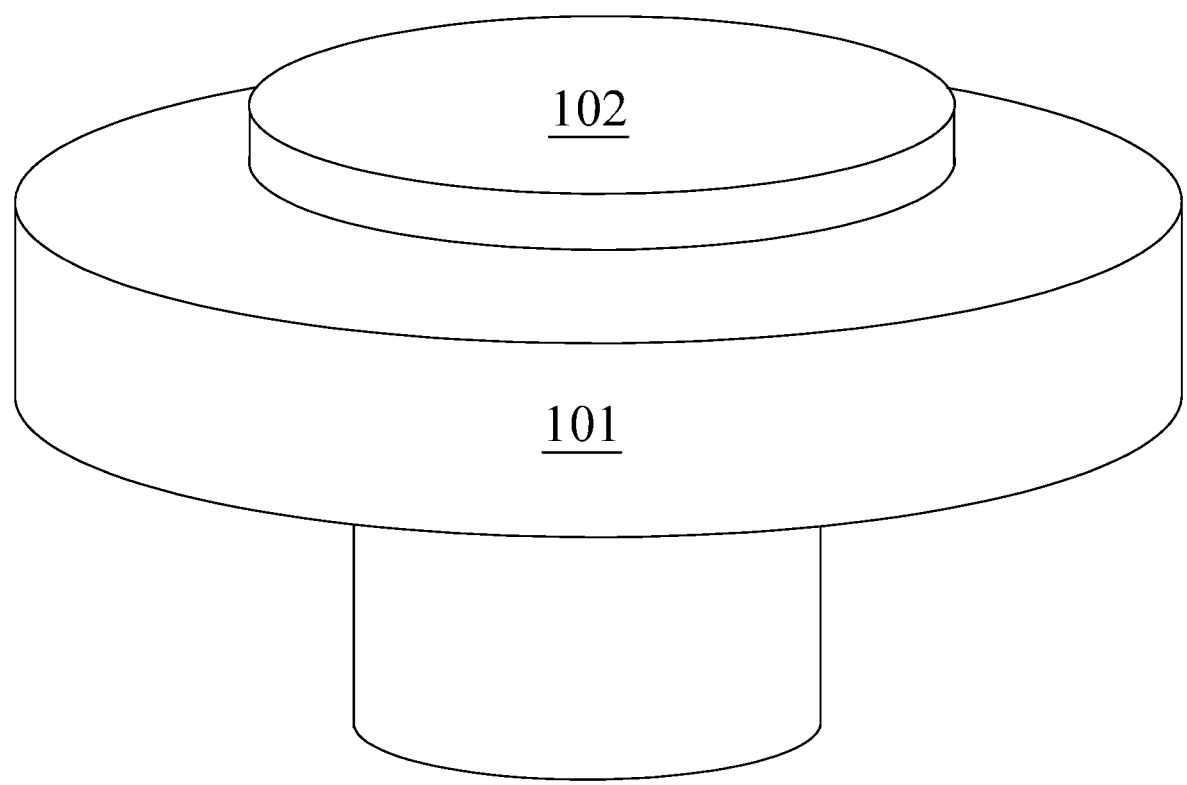
FIGS. 19-25 are schematic views of monitoring or analyzing a manufacturing of a semiconductor structure by a method of FIG. 18 in accordance with some embodiments of the present disclosure.

In operation 401, the semiconductor structure 102 is provided or received as shown in FIG. 19. In some embodiments, the operation 401 is substantially the same as the operation 201 and the operation 301.

Figure 20:
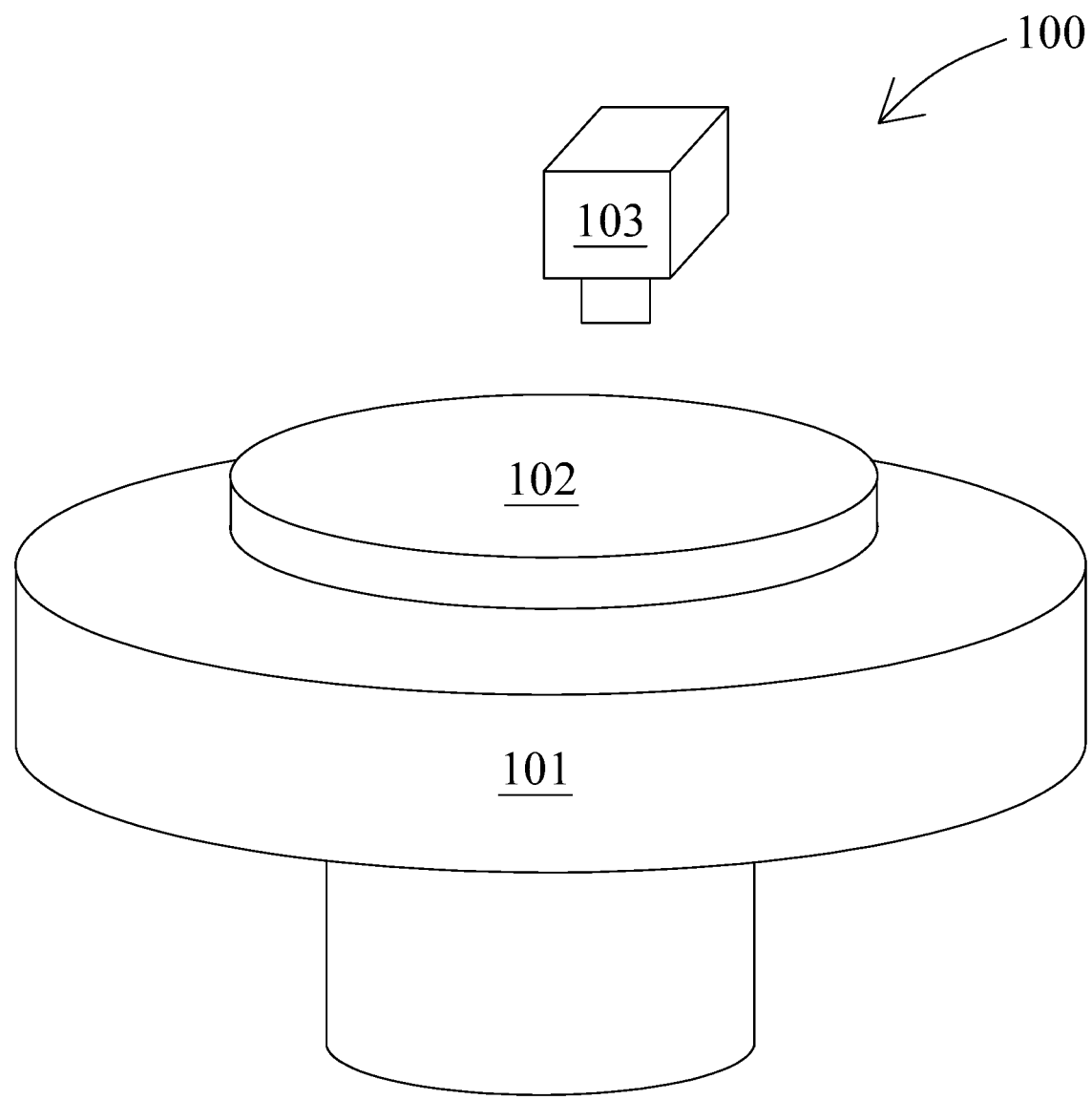

In operation 402, the camera 103 is provided as shown in FIG. 20. In some embodiments, the camera 103 is a high speed camera and configured to capture at least 1000 images of the semiconductor structure per second. In some embodiments, the camera 103 is placed adjacent to an edge of the stage 101 or an edge of the substrate 102. In some embodiments, the operation 402 is substantially the same as the operation 202 and the operation 302.

Figure 21:
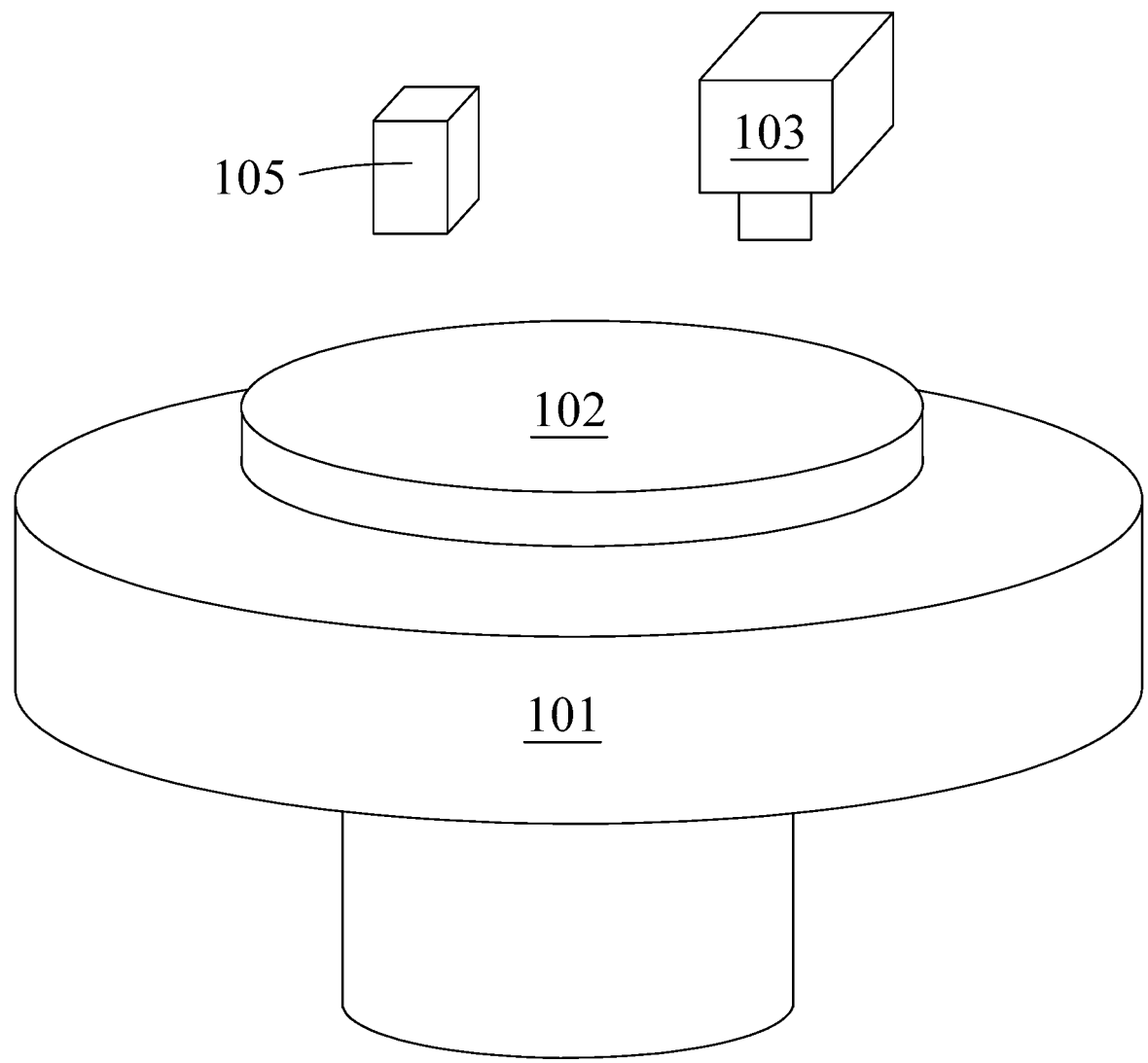

In operation 403, a first nozzle 105 is provided as shown in FIG. 21. In some embodiments, the first nozzle 105 is disposed over the semiconductor structure 102. In some embodiments, the first nozzle 105 is disposed above the semiconductor structure 102. In some embodiments, the first nozzle 105 is configured to discharge a liquid or fluid towards the semiconductor structure 102.

Figure 22:
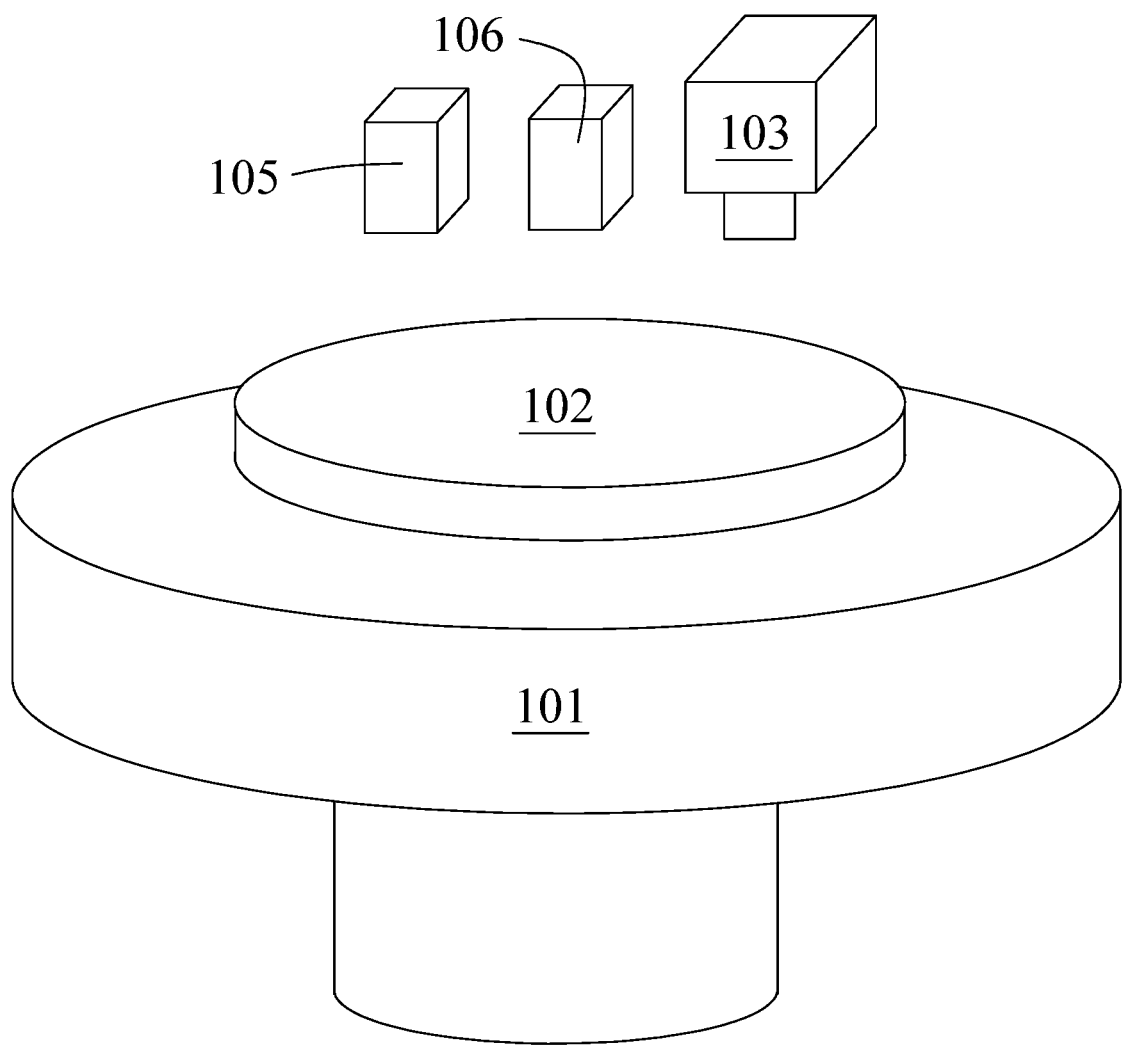

In operation 404, a second nozzle 106 is provided as shown in FIG. 22. In some embodiments, the second nozzle 106 is disposed over the semiconductor structure 102. In some embodiments, the second nozzle 106 is disposed above the semiconductor structure 102. In some embodiments, the second nozzle 106 is configured to discharge a liquid or fluid towards the semiconductor structure 102. In some embodiments, the camera 103 is optically focused on an outlet of the first nozzle 105 and an outlet of the second nozzle 106. In some embodiments, an interior acute angle is present between a surface of the substrate 102, the camera 103 and the outlet of the first nozzle 105. In some embodiments, the interior acute angle is present between the surface of the substrate 102, the camera 103 and the outlet of the second nozzle 106.

Figure 23:
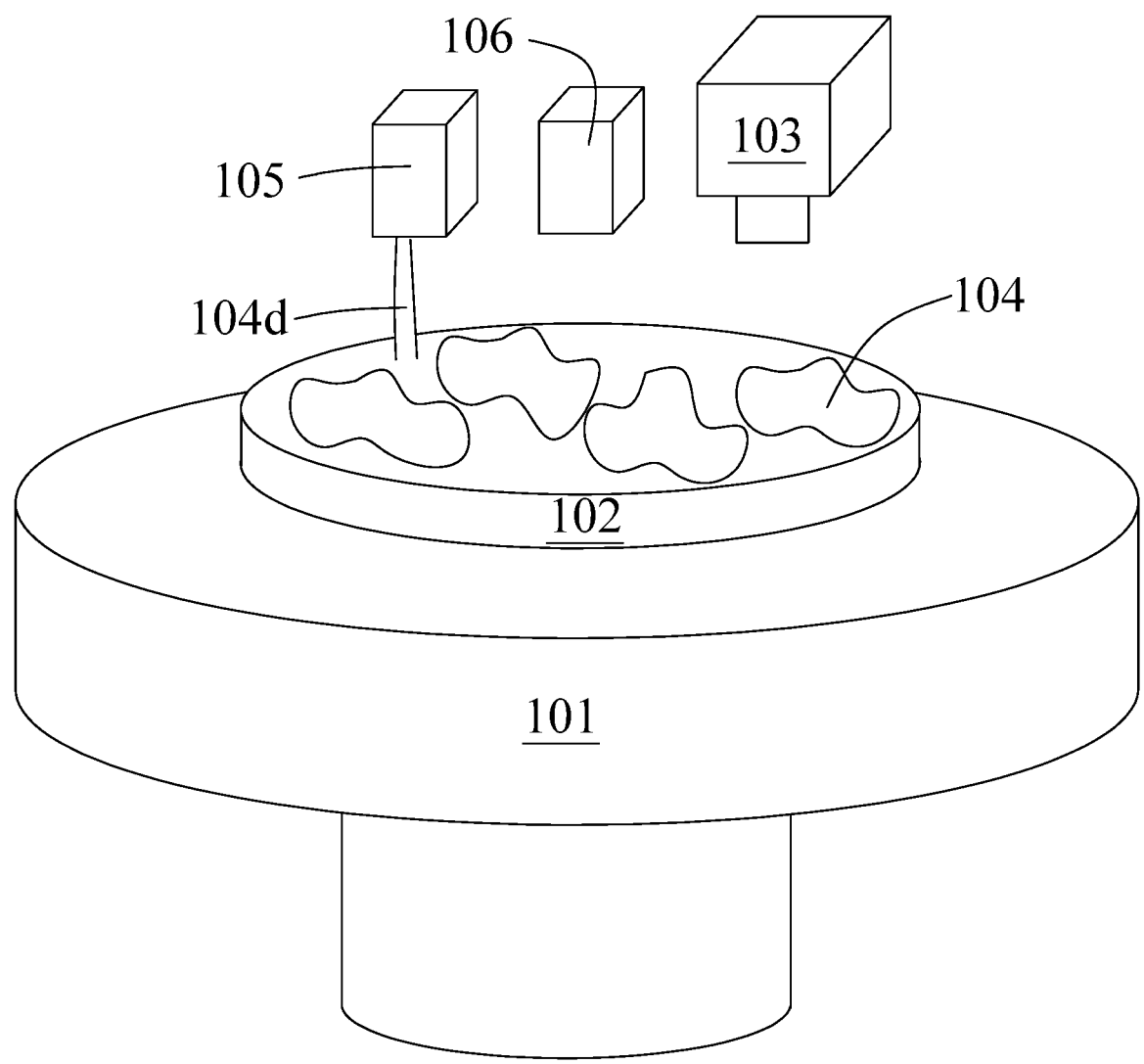

In operation 405, a first liquid substance 104d is disposed from the first nozzle 105 towards the semiconductor structure 102 in a first flow rate as shown in FIG. 23. In some embodiments, the first liquid substance 104d is flowed out from the first nozzle 105 to dispose the first liquid substance 104d over the semiconductor structure 102. In some embodiments, the first liquid substance 104d includes water or the like. In some embodiments, the first liquid substance 104d is disposed by spraying, spinning or any other suitable operations.

Figure 24:
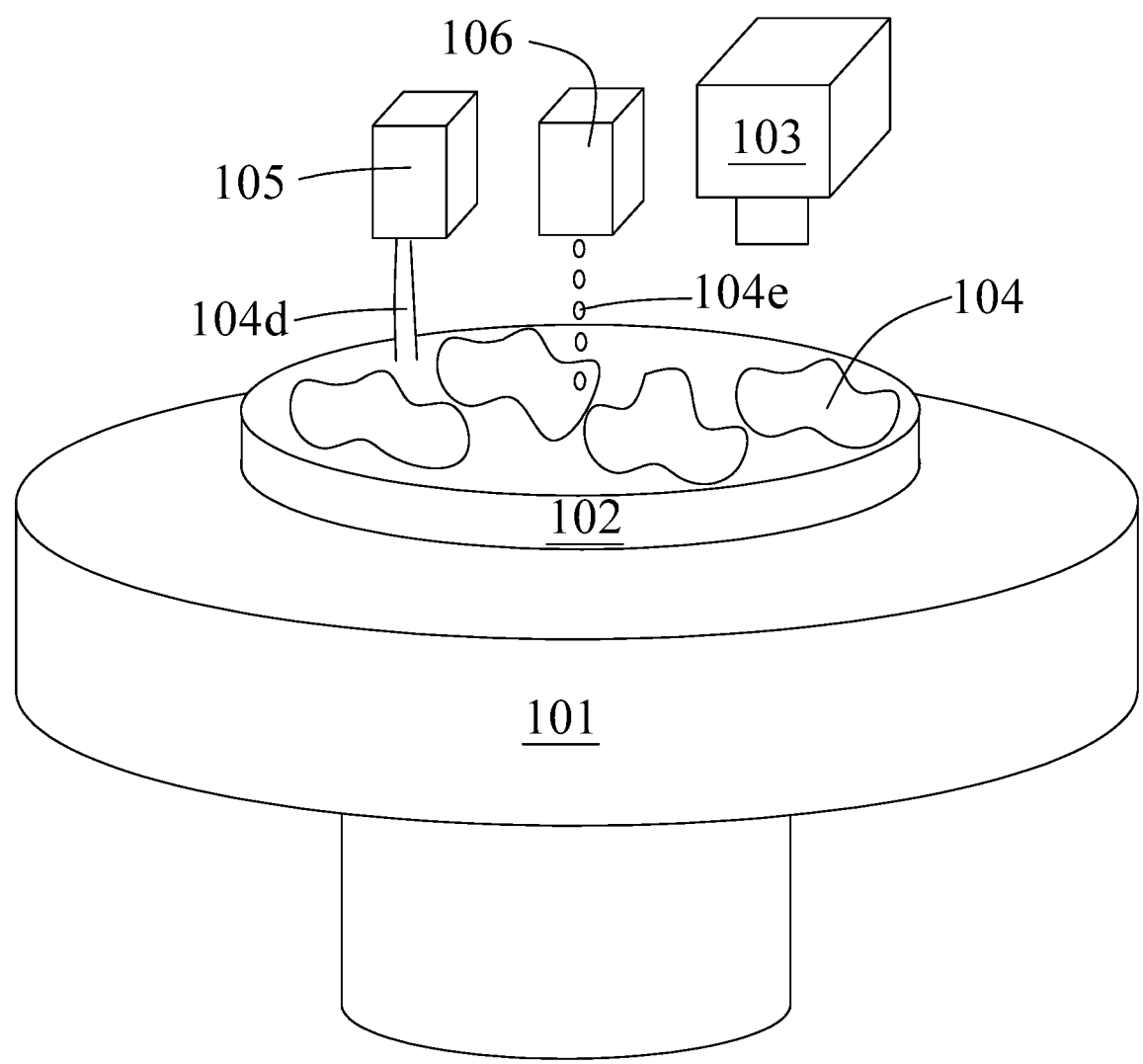

In operation 406, several first images and several second images are captured by the camera 103 as shown in FIGS. 23 and 24. In some embodiments as shown in FIG. 23, the first images include images of the first nozzle 105 and images of the first liquid substance 104d flowing out from the first nozzle 105 in the first flow rate, and the second images include images of the second nozzle 106.

In some embodiments as shown in FIG. 24, the first images include images of the first nozzle 105 and images of the first liquid substance 104d flowing out from the first nozzle 105 in the first flow rate, and the second images include images of the second nozzle 106 and images of a second liquid substance 104e leaking out from the second nozzle 106 in a second flow rate. In some embodiments, the second liquid substance 104e is leaked out from the second nozzle 106 upon the disposing of the first liquid substance 104d from the first nozzle 105 (the operation 405). In some embodiments, the second flow rate is substantially slower than the first flow rate. In some embodiments, the second liquid substance is a chemical or the like.

In some embodiments, the first images and the second images are captured upon the disposing of the first liquid substance 104d (the operation 405). In some embodiments as shown in FIG. 23, an electromagnetic radiation such as visible light, IR, UV, etc. reflected by the first nozzle 105, the first liquid substance 104d and the second nozzle 106 is received by the camera 103 to obtain the first images and the second images. In some embodiments, the electromagnetic radiation is transmitted towards the first nozzle 105, the first liquid substance 104d and the second nozzle 106 and then is received from the first nozzle 105, the first liquid substance 104d and the second nozzle 106 by the camera 103 to obtain the first images and the second images.

In some embodiments as shown in FIG. 24, a source over the first apparatus 100 emits an electromagnetic radiation towards the first nozzle 105, the first liquid substance 104d, the second nozzle 106 and the second liquid substance 104e, and the electromagnetic radiation reflected by the first nozzle 105, the first liquid substance 104d, the second nozzle 106 and the second liquid substance 104e is received by the camera 103 to obtain the first images and the second images. In some embodiments, the electromagnetic radiation is transmitted towards the first nozzle 105, the first liquid substance 104d, the second nozzle 106 and the second liquid substance 104e, and then is reflected by the first nozzle 105, the first liquid substance 104d, the second nozzle 106 and the second liquid substance 104e. The reflected electromagnetic radiation is received by the camera 103 to obtain the first images and the second images.

In operation 407, the first images and the second images are analyzed. In some embodiments, the first images and the second images captured by the camera 103 are analyzed by image recognition system or the like. In some embodiments, the analysis of the first images and the second images includes analyzing and obtaining the first flow rate of the first liquid substance 104d or the second flow rate of the second liquid substance 104e.

In operation 408, the leakage of the second liquid substance 104e from the second nozzle 106 towards the semiconductor structure 102 in the second flow rate is identified based on the analysis of the first images and the second images. In some embodiments, the leakage of the second liquid substance 104e is identified by comparing the second flow rate with the first flow rate or by comparing the first images with the second images.

In some embodiments, the first flow rate and the second flow rate are obtained by analyzing the first images and the second images. In some embodiments, the leakage of the second liquid substance 104e is identified when the second liquid substance 104e is flowed out from the second nozzle 106 in the second flow rate. In some embodiments, a signal is generated when the leakage of the second liquid substance 104e is identified.

Figure 25:
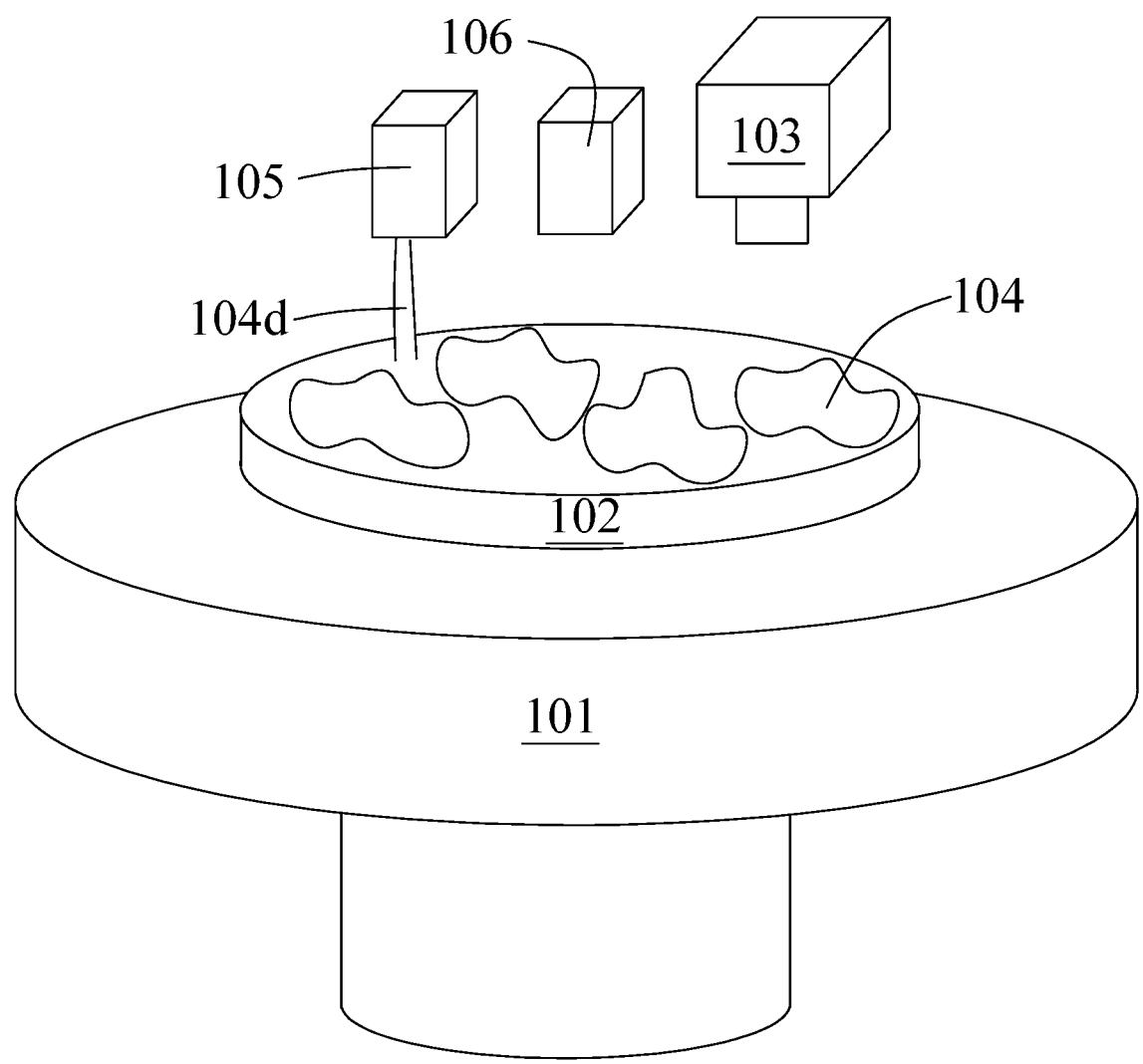

In operation 409, a response is performed based on the identification of the leakage of the second liquid substance 104e from the second nozzle 106 as shown in FIG. 25. In some embodiments, the performance of the response includes adjusting the second nozzle 106 to terminate the leakage of the second liquid substance 104e from the second nozzle 106. In some embodiments, the response is performed immediately after the identification of the leakage of the second liquid substance (the operation 408). As such, a real time feedback is generated after identification of the leakage, and a real time response is performed based on the real time feedback. In some embodiments, the response (such as the removal of the residue 104c) is performed once the region 102a of the semiconductor structure 102 is identified.

In some embodiments, after the adjustment of the second nozzle 106 (the operation 409), the first images and the second images are captured by the camera 103 and are analyzed. In some embodiments, the leakage of the second liquid substance 104e is still occurred after the adjustment of the second nozzle 106, that is, the leakage of the second liquid substance 104e can still be identified based on the analysis of the first images and the second images. In some embodiments, the response is performed again if the leakage of the second liquid substance 104e is still identified after the adjustment. In some embodiments, the response is performed until no leakage of the second liquid substance 104e is identified.

In the present disclosure, methods of monitoring or analyzing a manufacturing of a semiconductor structure are disclosed. The method includes identifying a region of the semiconductor structure where a residue of a liquid substance is disposed based on images analysis. A response would be performed immediately when the residue was detected. Further, the method includes deriving a physical property of a surface of the semiconductor structure based on the images captured by the camera, and identifying an abnormal region of the surface of the semiconductor structure based on the deriving of the physical property of the surface of the semiconductor structure. A response would be performed immediately when the abnormal region was found. Further, the method includes identifying leakage of a liquid substance from a nozzle based on analysis of images. Therefore, adjustment of the nozzle would be performed once the leakage was detected.

In some embodiments, a method of analyzing a semiconductor structure includes providing a semiconductor structure; providing a camera disposed around the semiconductor structure; disposing a liquid substance over the semiconductor structure; removing the liquid substance from the semiconductor structure; capturing a plurality of first images of the semiconductor structure by the camera; analyzing the plurality of first images; identifying a region of the semiconductor structure where a residue of the liquid substance is disposed based on the analysis of the plurality of first images; and performing a response based on the identification of the region of the semiconductor structure.

In some embodiments, the method further includes removing a portion of the semiconductor structure after the disposing of the liquid substance. In some embodiments, the performance of the response includes removing the residue of the liquid substance from the semiconductor structure. In some embodiments, the method further includes, after the removal of the residue of the liquid substance from the semiconductor structure, capturing a plurality of second images of the semiconductor structure by the camera; and analyzing the plurality of second images.

In some embodiments, the performance of the response includes adjusting at least one of parameters associated with the removal of the liquid substance from the semiconductor structure. In some embodiments, the performance of the response includes removing the residue of the liquid substance from the semiconductor structure based on the adjustment of the at least one of parameters. In some embodiments, the method further includes, after the removal of the residue of the liquid substance from the semiconductor structure, capturing a plurality of second images of the semiconductor structure by the camera; and analyzing the plurality of second images. In some embodiments, the capturing of the plurality of first images of the semiconductor structure, the analysis of the plurality of first images and the identification of the region of the semiconductor structure are performed after the removal of the liquid substance from the semiconductor structure.

In some embodiments, the removal of the liquid substance includes drying, blowing, baking or spinning. In some embodiments, the region of the semiconductor structure includes a recess indented into the semiconductor structure, and the residue of the liquid substance is disposed within the recess. In some embodiments, the capture of the plurality of first images includes receiving the electromagnetic radiation from the semiconductor structure by the camera. In some embodiments, the electromagnetic radiation includes infrared (IR), ultra violet (UV) or visible light.

In some embodiments, a method includes providing a semiconductor structure; providing a camera disposed around the semiconductor structure; disposing a liquid substance over a surface of the semiconductor structure; capturing a plurality of images of the surface of the semiconductor structure by the camera; deriving a physical property of the surface of the semiconductor structure based on the plurality of images captured by the camera; identifying an abnormal region of the surface of the semiconductor structure based on the deriving of the physical property of the surface of the semiconductor structure; and performing a response based on the identification of the abnormal region of the surface of the semiconductor structure.

In some embodiments, the abnormal region of the surface of the semiconductor structure is hydrophobic. In some embodiments, the camera is a high speed camera and configured to capture at least 1000 images of the surface of the semiconductor structure per second. In some embodiments, the performance of the response includes unloading the semiconductor structure. In some embodiments, the method further includes identifying a normal region of the surface of the semiconductor structure based on the deriving of the physical property of the surface of the semiconductor structure, wherein the normal region of the surface of the semiconductor structure is hydrophilic.

In some embodiments, a method includes providing a semiconductor structure; providing a camera disposed around the semiconductor structure; providing a first nozzle disposed over the semiconductor structure; providing a second nozzle disposed over the semiconductor structure; disposing a first liquid substance from the first nozzle towards the semiconductor structure in a first flow rate; capturing a plurality of first images including the first nozzle and the first liquid substance flowed out from the first nozzle, and a plurality of second images including the second nozzle or a second liquid substance leaked out from the second nozzle by the camera; analyzing the plurality of first images and the plurality of second images; identifying the leakage of the second liquid substance from the second nozzle towards the semiconductor structure in a second flow rate based on the analysis of the plurality of first images and the plurality of second images; and performing a response based on the identification of the leakage of the second liquid substance from the second nozzle, wherein the second flow rate is substantially slower than the first flow rate.

In some embodiments, the performance of the response includes adjusting the second nozzle to terminate the leakage of the second liquid substance from the second nozzle. In some embodiments, the second liquid substance is leaked out from the second nozzle upon the disposing of the first liquid substance from the first nozzle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
providing a semiconductor structure;
providing a camera disposed around the semiconductor structure;
disposing a liquid substance over the semiconductor structure;
removing the liquid substance from the semiconductor structure;
capturing a plurality of first images of the semiconductor structure by the camera;
analyzing the plurality of first images;
identifying a region of the semiconductor structure where a residue of the liquid substance is disposed based on the analysis of the plurality of first images; and
removing the residue of the liquid substance from the semiconductor structure after the identification of the region of the semiconductor structure.

2. The method of claim 1, further comprising removing a portion of the semiconductor structure after the disposing of the liquid substance.

3. The method of claim 1, wherein the region of the semiconductor structure is absent after the removal of the residue of the liquid substance from the semiconductor structure.

4. The method of claim 1, further comprising after the removal of the residue of the liquid substance from the semiconductor structure:
capturing a plurality of second images of the semiconductor structure by the camera; and
analyzing the plurality of second images.

5. The method of claim 1, further comprising adjusting at least one of parameters associated with the removal of the liquid substance from the semiconductor structure.

6. The method of claim 5, wherein the residue of the liquid substance is removed from the semiconductor structure based on the adjustment of the at least one of parameters.

7. The method of claim 6, further comprising after the removal of the residue of the liquid substance from the semiconductor structure:
capturing a plurality of second images of the semiconductor structure by the camera; and
analyzing the plurality of second images.

8. The method of claim 1, wherein the capturing of the plurality of first images of the semiconductor structure, the analysis of the plurality of first images and the identification of the region of the semiconductor structure are performed after the removal of the liquid substance from the semiconductor structure.

9. The method of claim 1, wherein the removal of the liquid substance includes drying, blowing, baking or spinning.

10. The method of claim 1, wherein the region of the semiconductor structure includes a recess indented into the semiconductor structure, and the residue of the liquid substance is disposed within the recess.

11. The method of claim 1, wherein the capture of the plurality of first images includes receiving the electromagnetic radiation from the semiconductor structure by the camera.

12. The method of claim 11, wherein the electromagnetic radiation includes infrared (IR), ultra violet (UV) or visible light.

13. A method, comprising:
providing a semiconductor structure;
providing a camera disposed above the semiconductor structure;
disposing a liquid substance over the semiconductor structure;
removing the liquid substance from the semiconductor structure;
capturing a plurality of images of the semiconductor structure by the camera;
analyzing the plurality of images;
identifying a residue of the liquid substance disposed over or within the semiconductor structure based on the analysis of the plurality of images; and adjusting at least one of parameters associated with the removal of the liquid substance from the semiconductor structure; and removing the residue from the semiconductor structure based on the identification of the residue and the adjustment of the at least one of parameters.

14. The method of claim 13, wherein the residue is present after the removal of the liquid substance, and the residue is absent after the removal of the residue.

15. The method of claim 13, wherein the residue is trapped by a recess of the semiconductor structure indented into the semiconductor structure after the removal of the liquid substance and before the removal of the residue.

16. The method of claim 13, wherein the at least one of parameters includes rotational speed of the semiconductor structure or duration of rotation of the semiconductor structure.

17. The method of claim 13, wherein the liquid substance is water, deionized water or chloroform.

18. A method, comprising:

providing a semiconductor structure;

providing a camera disposed above the semiconductor structure;

disposing a liquid substance over the semiconductor structure to form a coating on a surface of the semiconductor structure;

capturing a plurality of first images of the coating by the camera;

analyzing the plurality of first images;

identifying a first excessive liquid substance disposed over the coating based on the analysis of the plurality of first images;

performing a first removal of the first excessive liquid substance based on the identification of the first excessive liquid substance;

capturing a plurality of second images of the coating by the camera;

analyzing the plurality of second images;

identifying a second excessive liquid substance disposed over the coating based on the analysis of the plurality of second images; and performing a second removal of the second excessive liquid substance based on the identification of the second excessive liquid substance.

19. The method of claim 18, further comprising:

capturing a plurality of third images of the coating by the camera;

analyzing the plurality of third images;

identifying a third excessive liquid substance disposed over the coating based on the analysis of the plurality of third images; and performing a third removal of the third excessive liquid substance based on the identification of the third excessive liquid substance.

20. The method of claim 18, wherein the second excessive liquid substance is substantially less than the first excessive substance.

* * * * *